United States Patent
Kim et al.

(10) Patent No.: US 11,763,989 B2
(45) Date of Patent: Sep. 19, 2023

(54) DIELECTRIC MONOLAYER THIN FILM, CAPACITOR AND SEMICONDUCTOR DEVICE EACH INCLUDING THE SAME, AND METHOD OF FORMING THE DIELECTRIC MONOLAYER THIN FILM

(71) Applicants: Samsung Electronics Co., Ltd., Suwon-si (KR); National Institute for Materials Science, Ibaraki (JP)

(72) Inventors: Hyungjun Kim, Suwon-si (KR); Taniguchi Takaaki, Ibaraki (JP); Sasaki Takayoshi, Ibaraki (JP); Osada Minoru, Ibaraki (JP); Chan Kwak, Yongin-si (KR); Youngnam Kwon, Suwon-si (KR); Changsoo Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 378 days.

(21) Appl. No.: 17/038,904

(22) Filed: Sep. 30, 2020

(65) Prior Publication Data
US 2021/0110975 A1    Apr. 15, 2021

(30) Foreign Application Priority Data
Oct. 10, 2019   (KR) .......................... 10-2019-0125673

(51) Int. Cl.
*H01G 4/12*    (2006.01)
*H01G 4/005*   (2006.01)
*H01L 49/02*   (2006.01)

(52) U.S. Cl.
CPC ........... *H01G 4/1209* (2013.01); *H01G 4/005* (2013.01); *H01L 28/56* (2013.01)

(58) Field of Classification Search
None
See application file for complete search history.

(56) References Cited

U.S. PATENT DOCUMENTS

| 6,197,651 | B1 | 3/2001 | Shan |
| 6,300,216 | B1 | 10/2001 | Shan |

(Continued)

FOREIGN PATENT DOCUMENTS

| JP | 4956736 B2 | 6/2012 |
| KR | 10-2017-0016145 A | 2/2017 |

(Continued)

OTHER PUBLICATIONS

Young-Shin Lee, et al., "Dielectric properties of single crystal Sr2Nb3O10 dielectric nanosheet thin films by electrophoretic deposition (EPD) and post deposition treatments," Journal of Alloys and Compounds 711, p. 51-57, published in 2017.

(Continued)

*Primary Examiner* — Benjamin P Sandvik
(74) *Attorney, Agent, or Firm* — HARNESS, DICKEY & PIERCE, P.L.C.

(57) ABSTRACT

Provided are a dielectric monolayer thin film, a capacitor and a semiconductor device each including the dielectric monolayer thin film, and a method of forming the dielectric monolayer thin film, the dielectric monolayer thin film including an oxide which is represented by Formula 1 and has a perovskite-type crystal structure, wherein the oxide has a surface chemically bonded with hydrogen.

$$A_2B_{n-3}C_nO_{3n+1} \quad \text{<Formula 1>}$$

wherein, in Formula 1, A is a divalent element,
B is a monovalent element,
C is a pentavalent element, and
n is a number from 3 to 8.

22 Claims, 12 Drawing Sheets

(56) References Cited

U.S. PATENT DOCUMENTS

| | | | |
|---|---|---|---|
| 6,573,211 B2 | 6/2003 | Tatsumi | |
| 7,352,022 B2 | 4/2008 | Lee et al. | |
| 9,082,551 B2 | 7/2015 | Osada et al. | |
| 2010/0226067 A1* | 9/2010 | Osada | H01L 21/31691 156/60 |
| 2013/0244016 A1* | 9/2013 | Osada | H01G 4/12 428/220 |
| 2014/0150966 A1* | 6/2014 | Osada | H01L 28/56 156/60 |
| 2017/0040089 A1 | 2/2017 | Lee et al. | |
| 2018/0286586 A1 | 10/2018 | Jung et al. | |
| 2019/0131075 A1 | 5/2019 | Park et al. | |
| 2019/0131077 A1 | 5/2019 | Son et al. | |
| 2020/0234888 A1 | 7/2020 | Son et al. | |

FOREIGN PATENT DOCUMENTS

| | | |
|---|---|---|
| KR | 10-2018-0111354 A | 10/2018 |
| KR | 10-2019-0047378 A | 5/2019 |

OTHER PUBLICATIONS

Wei Huang, et al., "Effect of UV/ozone treatment on polystyrene dielectric and its application on organic field-effect transistors," Nanoscale Research Letters 2014, 9:479.

Yeji Song, et al., "Massive hydration-driven swelling of layered perovskite niobate crystals in aqueous solutions of organo-ammonium bases," Dalton Transactions, 47, 3022-3028, published on Oct. 23, 2017.

Woong-Hee Lee, et al., "Synthesis of Sr2Nb3O10 nanosheets and their application for growth of thin film using an electrophoretic method," Journal American Ceramic Society, Published in 2017.

Minoru Osada et al., "A- and B-Site Modified Perovskite Nanosheets and Their Integrations into High-k Dielectric Thin Films," International Journal of Applied Ceramic Technology; Ceramic Product Development and Commercialization, No. 9, No. 1, p. 29-36, Published in 2012.

J.A. Kittl, et al., "High-k dielectrics for future generation memory devices (Invited Paper)," Microelectronic Engineering 86, p. 1789-1795, Available online Mar. 13, 2009.

* cited by examiner

DIELECTRIC MONOLAYER THIN FILM, CAPACITOR AND SEMICONDUCTOR DEVICE EACH INCLUDING THE SAME, AND METHOD OF FORMING THE DIELECTRIC MONOLAYER THIN FILM

CROSS-REFERENCE TO RELATED APPLICATION

This application claims the benefit of Korean Patent Application No. 10-2019-0125673, filed on Oct. 10, 2019, in the Korean Intellectual Property Office, the disclosure of which is incorporated herein in its entirety by reference.

BACKGROUND

1. Field

The present disclosure relates to a dielectric monolayer thin film, a capacitor and a semiconductor device each including the dielectric monolayer thin film, and a method of forming the dielectric monolayer thin film.

2. Description of Related Art

Recently, as the trend toward high functionalization, high efficiency, smaller sizes and lighter weights of electronic devices rapidly progresses, the miniaturization and high functionalization of electronic parts are rapidly progressing, and the usage of electronic parts which require high reliability is greatly increasing.

Such electronic parts may include capacitors. Recently, as dielectrics for capacitors, perovskite-based two-dimensional nanosheets are known. However, such two-dimensional nanosheets may have a reduced dielectric constant due to organic substances adsorbed onto the surface thereof during the manufacturing process thereof. Accordingly, improvements are required in this regard.

SUMMARY

Provided is a dielectric monolayer thin film having improved dielectric constant characteristics.

Provided is a capacitor including the dielectric monolayer thin film.

Provided is a semiconductor device including the dielectric monolayer thin film.

Provided is a method of forming the dielectric monolayer thin film.

Additional aspects will be set forth in part in the description which follows and, in part, will be apparent from the description, or may be learned by practice of the presented embodiments of the disclosure.

According to an aspect of the disclosure, is a dielectric monolayer thin film comprising an oxide represented by Formula 1, the oxide having a perovskite-type crystal structure, and having a surface chemically bonded with hydrogen:

$$A_2B_{n-3}C_nO_{3n+1} \qquad \text{<Formula 1>}$$

wherein, in Formula 1, A is a divalent element, B is a monovalent element, C is a pentavalent element, and n is a number from 3 to 8.

According to another aspect of the disclosure, provided is a capacitor including: a first electrode; a second electrode; and the dielectric monolayer thin film between the first electrode and the second electrode.

According to another aspect of the disclosure, provided is a semiconductor device including the above-described dielectric monolayer thin film.

According to another aspect of the disclosure, provided is a method of forming a dielectric monolayer thin film having a surface chemically bonded with hydrogen, the method comprising: forming a dielectric monolayer thin film comprising an oxide which is represented by Formula 1 and has a perovskite-type crystal structure; and treating the dielectric monolayer thin film with UV and reactive gas, thereby forming a dielectric monolayer thin film including the oxide which is represented by Formula 1, has the perovskite-type crystal structure, and has the surface chemically bonded with hydrogen:

$$A_2B_{n-3}C_nO_{3n+1} \qquad \text{<Formula 1>}$$

wherein, in Formula 1, A is a divalent element, B is a monovalent element, C is a pentavalent element, and n is a number from 3 to 8.

In an embodiment, the reactive gas may comprise at least one of ozone ($O_3$), oxygen ($O_2$), nitrogen dioxide ($NO_2$), dinitrogen oxide ($N_2O$), water vapor, air, hydrogen peroxide, methane, ethane, propane, butane, pentane, hexane, heptanes, octane, and hydrogen sulfide.

In an embodiment, the forming of the dielectric monolayer thin film comprising the oxide which is represented by Formula 1 and a perovskite-type crystal structure may include: obtaining a two-dimensional nanosheet monolayer including the oxide which is represented by Formula 1 and has the perovskite-type crystal structure; and forming the dielectric monolayer thin film using the two-dimensional nanosheet monolayer.

In an embodiment, the forming of the two-dimensional nanosheet monolayer may comprise obtaining a layered proton-exchange ceramic material through proton-exchange reaction of a layered ceramic material represented by Formula 4; and intercalating an intercalation material into the layered proton-exchange ceramic material to exfoliate a nanosheet therefrom:

$$D[A_2B_{n-3}C_nO_{3n+1}] \qquad \text{<Formula 4>}$$

wherein, in Formula 4, A may be a divalent element, B may be a monovalent element, C may be a pentavalent element, n may be a number from 3 to 8, and D may comprise at least one of Li, Na, K, Rb, and Cs.

In an embodiment, the forming of the dielectric monolayer thin film including the oxide which is represented by Formula 1 and the perovskite-type crystal structure may be performed through a chemical vapor deposition process, an organic metal chemical vapor deposition process, a liquid phase epitaxy process, a sol-gel process, a sputtering process, or a pulsed laser deposition process or a combination thereof.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
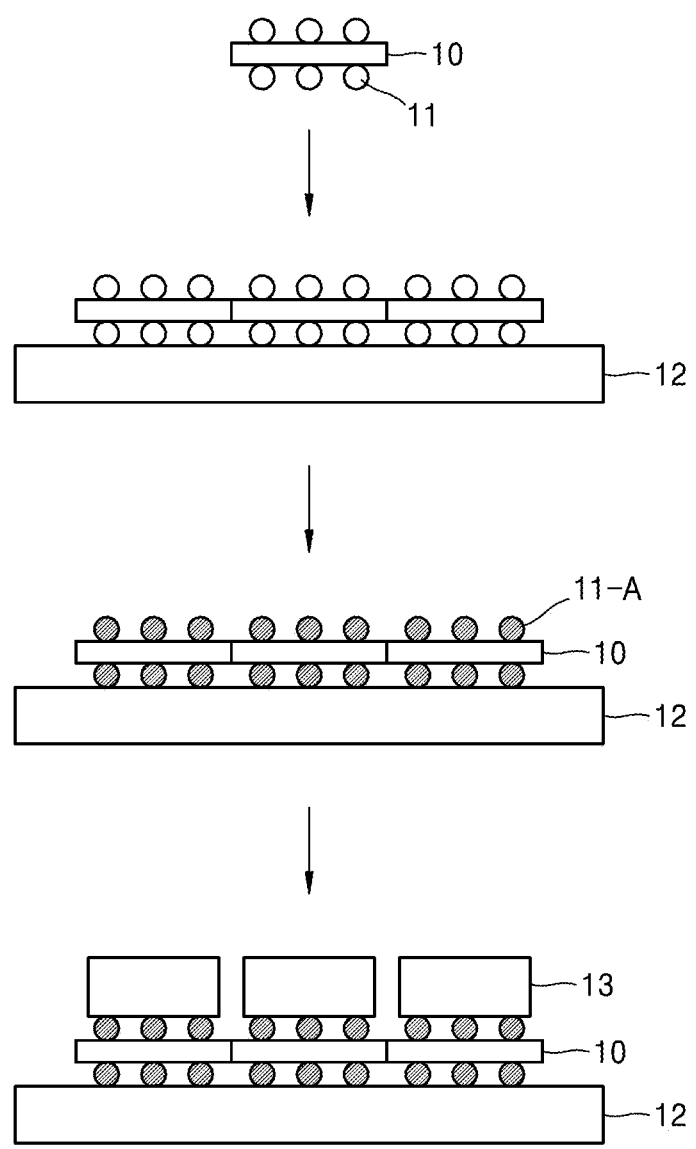
FIG. 1 illustrates a process of manufacturing a capacitor including a dielectric monolayer thin film according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Hereinafter, embodiments of a dielectric monolayer thin film, a capacitor and a semiconductor device each including the dielectric monolayer thin film, and a method of forming the dielectric monolayer thin film will now be described in greater detail.

According to an aspect of the disclosure, provided is a dielectric monolayer thin film including an oxide which is represented by Formula 1 and has a perovskite-type crystal structure, wherein the oxide has a surface chemically bonded with hydrogen.

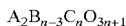

<Formula 1>

In Formula 1, A may be a divalent element; B may be a monovalent element; C may be a pentavalent element; and n may be a number from 3 to 8, In Formula 1, n may be a number from 3 to 6, for example, a number from 3 to 5. For example, n may be 3, 4, 5, 6, 7, or 8.

For example, in Formula 1, A may be calcium (Ca), strontium (Sr), barium (Ba) or a combination thereof, B may be sodium (Na), potassium (K), rubidium (Rb), cesium (Cs) or a combination thereof, and/or C may be vanadium (V), niobium (Nb), tantalum (Ta) or a combination thereof.

The dielectric monolayer thin film, which is a monomolecular layer, may have a thickness of about 5 nm or smaller, for example, about 0.5 nm to about 5 nm, about 0.5 nm to about 3.2 nm, about 1.5 nm to about 3.2 nm, and/or about 1.5 nm to about 3 nm. The dielectric monolayer thin film may be varied according to the synthesis and exfoliation conditions in the synthesis and exfoliation of a bulk ceramic material.

The dielectric monolayer thin film may have a horizontal size of about 10 nm to about 1000 μm, for example, about 100 nm to about 500 μm. As used herein, the horizontal size may represent the length of the major axis of the dielectric monolayer thin film.

The thickness and horizontal size of the dielectric monolayer thin film may be identified using any method, not specifically limited, for example, scanning electron microscopy (SEM).

As the degree of integration of semiconductor memory devices increases, capacitors having a smaller size and a high capacitance are beneficial. In particular, since higher capacitance is proportional to the dielectric constant of a dielectric film research into the dielectric film of the capacitor is being actively conducted.

A dielectric multilayer thin film used as a dielectric film of a capacitor may be manufactured by stacking two-dimensional nanosheets. The dielectric multilayer thin film thus prepared may have a reduced dielectric constant due to an organic substance on the surface or interlayer of the thin film. To address such problems, a method comprising UV treatment and/or thermal treatment on the dielectric multilayer thin film has been suggested. However, when the above-described method is used, the organic substance may still remain on the interlayer of the dielectric multilayer thin film, and thus a dielectric constant improvement effect may not reach a satisfactory level.

To solve the above-described problems, the present inventors achieved a dielectric monolayer thin film having improved dielectric constant by obtaining a two-dimensional nanosheet monolayer and treating the two-dimensional nanosheet monolayer with UV and reactive gas to modify the surface of the two-dimensional nanosheet monolayer with hydrogen. When the surface of the two-dimensional nanosheet monolayer is modified with hydrogen, the dielectric monolayer thin film thus obtained may have a structure in which the surface of the two-dimensional nanosheet monolayer is chemically bonded with hydrogen, and have a high dielectric constant. Accordingly, a capacity including the two-dimensional nanosheet monolayer may have an increased capacity.

The capacitance of a capacitor using a dielectric is expressed by Equation 1.

$$C = \varepsilon_r \varepsilon_0 \frac{A}{d}$$ ⟨Equation 1⟩

In Equation 1, $\varepsilon_0$ is the permittivity of vacuum, $\varepsilon_r$ is a dielectric constant, A is the area of the capacitor, and d is the thickness of the dielectric.

As depicted in Equation 1, the capacitance of a capacitor is proportional to the area of an electrode and the dielectric constant of a dielectric, and is inversely proportional to the thickness of the dielectric. The permittivity of a vacuum (co) is an ideal, physical constant. Accordingly, other than changing the area of the electrode and the thickness of the dielectric, it is also possible to increase the capacitance of a capacitor by increasing the dielectric constant.

The dielectric monolayer thin film according to one or more embodiments may have a good dielectric constant. Accordingly, a capacitor with increased capacitance may be manufactured using the dielectric monolayer thin film according to one or more embodiments.

In one or more embodiments, the dielectric monolayer thin film may have a dielectric constant of, at 100 KHz, for example, 400 or greater, 450 or greater, 500 or greater, or, for example, a dielectric constant within a range of 500 to 1000. As the oxide included in the dielectric monolayer thin film has a high dielectric constant, a capacitor including the dielectric monolayer thin film may have increased capacitance.

The dielectric monolayer thin film according to one or more embodiments may reduce the leakage current of the capacitor by reducing the dielectric loss.

The oxide represented by Formula 1 may provide improved dielectric characteristics by having a perovskite-type crystal structure belonging to a polar space group or a non-polar space group other than the Pbnm space group. The polar space group which the oxide represented by Formula 1 belongs to may be, for example, the $Pc2_1n$ space group. The non-polar space group which the oxide represented by Formula 1 belongs to may be, for example, the Pcmn, P4/mbm, Pm-3m, or Cmcm space group. Also, the oxide represented by Formula 1 includes the P4 space group, the P4$^-$ space group, the P4/m space group, the P422 space group, the P4 mm space group, the P4$^-$m2 space group, the P4$^{-2}$ m space group, and the P4/mmm space group each having tetragonal symmetry. The oxide may have an increased dielectric constant due to the belonging to such a space group.

As used herein, the "two-dimensional nanosheet monolayer" means a thin film having a perovskite-type crystal structure and comprising of monolayer having a unit cell thickness of about 5 nm or less. The unit cell may include at least one perovskite unit having a thickness of about 0.5 nm. The unit cell may include, for example, 2 to 10 perovskite units, or 3 to 6 perovskite units. In one or more embodiments, the unit cell including 3 to 6 units may have a thickness of about 1.5 nm to about 3.2 nm.

The oxide represented by Formula 1 may be, for example, a compound represented by Formula 2.

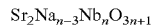
$Sr_2Na_{n-3}Nb_nO_{3n+1}$ <Formula 2>

In Formula 2, n may be 3, 4, 5, 6, 7, or 8.

In one or more embodiments, the oxide represented by Formula 1 may be, for example, $Sr_2Nb_3O_{10}$, $Sr_2NaNb_4O_{13}$, $Sr_2Na_2Nb_5O_{16}$, $Sr_2NaTa_4O_{13}$, $Sr_2Na_2Ta_5O_{16}$, $Sr_2KNb_4O_{13}$, $Sr_2K_2Nb_5O_{16}$, $Sr_2RbNb_4O_{13}$, $Sr_2Rb_2Nb_5O_{16}$, $Ca_2Nb_3O_{10}$, $Ca_2NaNb_4O_{13}$, $Ca_2Na_2Nb_5O_{16}$, $Ca_2KNb_4O_{13}$, $Ca_2K_2Nb_5O_{16}$, $Ca_2RbNb_4O_{13}$, $Ca_2Rb_2Nb_5O_{16}$, $Ca_2Ta_3O_{10}$, $Ca_2NaTa_4O_{13}$, $Ca_2Na_2Ta_5O_{16}$, $Ca_2KTa_4O_{13}$, $Ca_2K_2Ta_5O_{16}$, $Ca_2RbTa_4O_{13}$, $Ca_2Rb_2Ta_5O_{16}$, $Ba_2Nb_3O_{10}$, $Ba_2NaNb_4O_{13}$, $Ba_2Na_2Nb_5O_{16}$, $Ba_2KNb_4O_{13}$, $Ba_2K_2Nb_5O_{16}$, $Ba_2RbNb_4O_{13}$, $Ba_2Rb_2Nb_5O_{16}$, $Ba_2Ta_3O_{10}$, $Ba_2NaTa_4O_{13}$, $Ba_2Na_2Ta_5O_{16}$, $Ba_2KTa_4O_{13}$, $Ba_2K_2Ta_5O_{16}$, $Ba_2RbTa_4O_{13}$, $Ba_2Rb_2Ta_5O_{16}$, or a combination thereof.

The oxide may be aggregates of a plurality of primary particles (e.g., crystallites). The aggregates may include a plurality of primary particles with grain boundaries between the primary particles. The primary particles may include perovskite single crystals belonging to the $Pc2_1n$ space group. The primary particles may be single crystals or polycrystals.

The primary particles of the oxide may have an average diameter of, for example, about 0.1 um to about 20 um, about 0.5 um to about 20 um, about 1 um to about 20 um, about 1 um to about 10 um, about 2 um to about 9 um, about 3 um to about 8 um, about 4 um to about 8 um, or about 4 um to about 7 um. When the average particle diameter of the primary particles is too small abnormal grain growth may result from excessive sintering. When the average particle diameter of the primary particles is too large, it may be difficult to apply the primary particles to highly integrated devices. The average particle diameter of the primary particles may be obtained, for example, by measuring the diameters of the primary particles appearing in a scanning electron microscope (SEM) image and then calculating an arithmetic average thereof. The average particle diameter of the primary particles may also be obtained using any method of obtaining the average particle diameter of primary particles available in the art, not limited to such a method described above. The diameter of a primary particle may be, for example, the diameter of a primary particle when the primary particle is spherical, or may be, for example, the maximum distance between both ends of a primary particle when the primary particle is non-spherical.

According to another aspect of the disclosure, provided is a capacitor including a first electrode, a second electrode, and the dielectric monolayer thin film according to the example embodiments arranged between the first electrode and the second electrode.

The capacitor may be, for example, a metal-insulator-metal (MIM) capacitor.

A method of manufacturing a metal-insulator-metal (MIM) capacitor using the dielectric monolayer thin film will be described with reference to FIG. 1.

First, a two-dimensional nanosheet monolayer including an oxide represented by Formula 1, the oxide having a perovskite-type crystal structure, may be obtained. The two-dimensional nanosheet monolayer may have a structure including organic molecules 11 bound to the surfaces of the two-dimensional nanosheet 10, as shown in FIG. 1.

$A_2B_{n-3}C_nO_{3n+1}$ <Formula 1>

In Formula 1, A may be a divalent element, B may be a monovalent element, C may be a pentavalent element, and n may be a number from 3 to 8.

The organic molecules 11, which may originate from an intercalation material introduced during preparation the two-dimensional nanosheet. The organic molecules 11 may be a cationic organic material, for example, tributylammonium cations (TBA$^+$).

Subsequently, a dielectric monolayer thin film may be formed using the two-dimensional nanosheet monolayer. The two-dimensional nanosheet monolayer may be an exfoliated structure obtained through a process of proton exchange and/or a process of exfoliation of a layered ceramic material.

The dielectric monolayer thin film may be formed by obtaining a nanosheet composition containing the two-dimensional nanosheet monolayer and then coating the nanosheet composition on a surface of a substrate 12. The substrate 12 can comprise a conductive material, an insulating material, and/or a semiconductor material. A method of coating the nanosheet composition may be, for example, a Langmuir-Blodgett method, a layer-by-layer method, spin coating, slit coating, bar boating, or dip coating. The nanosheet composition including the two-dimensional nanosheet monolayer may be coated on an electrode using a solution process to thereby form the dielectric monolayer thin film. The dielectric monolayer thin film may be formed by coating using a Langmuir-Blodgett method, a layer-by-layer method, spin coating, slit coating, bar boating, or dip coating. However, embodiments are not limited to these methods.

In an embodiment, the two-dimensional nanosheet monolayer may be formed using a Langmuir-Blodgett method.

The two-dimensional nanosheet monolayer may be prepared by obtaining a layered proton-exchange ceramic material through proton exchange reaction of a layered ceramic material of Formula 4, intercalating an intercalation material into the layered proton-exchange ceramic material to obtain an intercalated layered ceramic material, and then exfoliating the intercalated layered ceramic material into a nanosheet monolayer.

$$D[A_2B_{n-3}C_nO_{3n+1}]$$ <Formula 4>

In Formula 4, A may be a divalent element, B may be a monovalent element, C may be a pentavalent element, n may be a number from 3 to 8, and D may be Li, Na, K, Rb, Cs, or a combination thereof.

The intercalation material may be a material inserted between the layers of the layered proton-exchange ceramic material to help exfoliate the ceramic material. The intercalation material may be a C1-C20 alkyl ammonium compound, for example TBA$^+$.

The proton exchange reaction of the layered ceramic material may enable formation of a layered proton-exchange ceramic material in which at least part of an alkali metal and/or an alkali earth metal is exchanged with hydrogen ions and/or hydronium ions (H$^3$O$^+$), through acid exchange treatment of the layered ceramic material with an acidic solution such as hydrochloric acid, nitric acid, and/or sulfuric acid.

The monolayer nanosheet may be a single-crystalline ceramic nanosheet, and may be stably dispersed in a solvent in a colloidal form. The solvent may be, for example, a high dielectric solvent, for example, at least one of water, an alcohol (e.g., methanol, ethanol, and/or propanol), acetonitrile, dimethyl sulfoxide, and/or dimethylformamide, propylene carbonate, but is not limited thereto.

The C1-C20 alkyl ammonium compound may be, for example, a tetramethylammonium compound such as tetramethylammonium hydroxide, a tetraethylammonium compound such as tetraethylammonium hydroxide, a tetrapropylammonium compound such as tetrapropylammonium hydroxide, a tetrabutylammonium compound such as tetrabutylammonium hydroxide, and/or a benzylalkylammonium compound such as benzylmethylammonium hydroxide, but is not limited thereto.

The C1 to C20 alkyl ammonium compounds may be provided in an aqueous solution form. The concentration of an alkyl ammonium aqueous solution may be about 0.01 mol % to about 20 mol % with respect to hydrogen ions (H$^+$) and/or hydronium ions (H$_3$O$^+$) of the layered proton-exchange ceramic material. The temperature and time of the intercalation treatment are not specifically limited. For example, the intercalation treatment may be performed at about 25° C. to about 80° C. for 1 day to 5 days. However, the intercalation temperature and time are not limited thereto. Centrifugation, ultrasonication, or a combination thereof may be further performed to assist the exfoliation.

The layered ceramic material may be, for example, KSr$_2$Nb$_3$O$_{10}$, KSr$_2$NaNb$_4$O$_{13}$, KSr$_2$Na$_2$Nb$_5$O$_{16}$, KSr$_2$NaTa$_4$O$_{13}$, KSr$_2$Na$_2$Ta$_5$O$_{16}$, KSr$_2$KNb$_4$O$_{13}$, KSr$_2$K$_2$Nb$_5$O$_{16}$, KSr$_2$RbNb$_4$O$_{13}$, KSr$_2$Rb$_2$Nb$_5$O$_{16}$, KCa$_2$Nb$_3$O$_{10}$, KCa$_2$NaNb$_4$O$_{13}$, KCa$_2$Na$_2$Nb$_5$O$_{16}$, KCa$_2$KNb$_4$O$_{13}$, KCa$_2$K$_2$Nb$_5$O$_{16}$, KCa$_2$RbNb$_4$O$_{13}$, KCa$_2$Rb$_2$Nb$_5$O$_{16}$, KCa$_2$Ta$_3$O$_{10}$, KCa$_2$NaTa$_4$O$_{13}$, KCa$_2$Na$_2$Ta$_5$O$_{16}$, KCa$_2$KTa$_4$O$_{13}$, KCa$_2$K$_2$Ta$_5$O$_{16}$, KCa$_2$RbTa$_4$O$_{13}$, KCa$_2$Rb$_2$Ta$_5$O$_{16}$, KBa$_2$Nb$_3$O$_{10}$, KBa$_2$NaNb$_4$O$_{13}$, KBa$_2$Na$_2$Nb$_5$O$_{16}$, KBa$_2$KNb$_4$O$_{13}$, KBa$_2$K$_2$Nb$_5$O$_{16}$, KBa$_2$RbNb$_4$O$_{13}$, KBa$_2$Rb$_2$Nb$_5$O$_{16}$, KBa$_2$Ta$_3$O$_{10}$, KBa$_2$NaTa$_4$O$_{13}$, KBa$_2$Na$_2$Ta$_5$O$_{16}$, KBa$_2$KTa$_4$O$_{13}$, KBa$_2$K$_2$Ta$_5$O$_{16}$, KBa$_2$RbTa$_4$O$_{13}$, KBa$_2$Rb$_2$Ta$_5$O$_{16}$, or a combination thereof.

The oxide of Formula 1 may be used as the two-dimensional nanosheet, as described above, and Sr$_2$Nb$_3$O$_{10}$, which is one of the oxides of Formula 1, is used in Reaction Scheme 1.

The surface of the dielectric monolayer thin film may have a cationic organic substance such as tributylammonium cations (TBA$^+$) bound thereto. The upper surface of such a dielectric monolayer thin film may be treated with UV and/or a reactive gas (e.g., ozone) to remove the cationic organic substance adsorbed on the surface of the two-dimensional nanosheet and modify the surface of the two-dimensional nanosheet into a form 11-A with hydrogen molecules bound thereto (see Reaction Scheme 1). As illustrated in FIG. 1, the surface of the two-dimensional nanosheet 10 has a structure in which hydrogen is chemically bound thereto.

[Reaction Scheme 1]

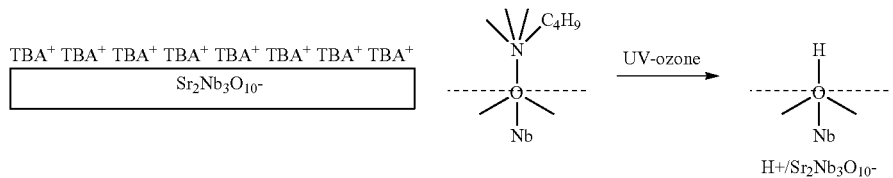

In the UV and reactive gas treatment, as the reactive gas, ozone (O$_3$), oxygen (O$_2$), methane, ethane, propane, butane, pentane, hexane, heptane, octane, hydrogen sulfide, or a combination thereof may be used.

The reactive gas may be, for example, an oxidizing agent. For example, the oxidizing agent may be ozone, oxygen or a combination thereof.

In an embodiment, when the dielectric monolayer thin film is irradiated with UV after oxygen is supplied onto the dielectric monolayer thin film, the oxygen may change into ozone.

The wavelength of UV light may be, for example, in a range of about 250 nm to about 400 nm. The UV radiation may be performed using a UV lamp with a power of about 200 W to about 400 W, for example, 250 W to about 350 W. The UV radiation time may vary depending on the UV wavelength range, power level, and/or the like. For example, the UV radiation time may be about 1 to 60 hours, about 5 to 60 hours, about 9 to 60 hours, about 12 to 60 hours, or about 12 to 24 hours. When the power and radiation time of the UV lamp are within these ranges, due to a high removal efficiency of the organic substance on the surface of the two-dimensional nanosheet monolayer thin film, the permittivity may be improved. As illustrated in FIG. 1, upper electrodes 13 may be stacked on the resulting structure to form a MIM capacitor.

A method of preparing a dielectric monolayer thin film according to an embodiment will now be described below.

A dielectric monolayer thin film according to an embodiment may be prepared by forming a dielectric monolayer thin film including an oxide which has a composition represented by Formula 1 and has a perovskite-type crystal structure; and treating the dielectric monolayer thin film with UV and reactive gas.

The forming of the dielectric monolayer thin film including the oxide which has the composition represented by Formula 1 and a perovskite-type crystal structure may include obtaining a two-dimensional nanosheet monolayer including the oxide which is represented by Formula 1 and has the perovskite-type crystal structure; and forming the dielectric monolayer thin film using the two-dimensional nanosheet monolayer. The step of using the dielectric monolayer thin film to form the dielectric monolayer thin film will be described in greater detail.

The forming of the two-dimensional nanosheet monolayer may include obtaining a layered proton-exchange ceramic material through proton exchange reaction of a layered ceramic material represented by Formula 4; and intercalating an intercalation material into the layered proton-exchange ceramic material to exfoliate a nanosheet therefrom.

In an embodiment, to prepare the dielectric monolayer thin film according to an embodiment, a dielectric monolayer thin film including the oxide having a composition represented by Formula 1 and a perovskite-type crystal structure may be formed. Then, the formed dielectric monolayer thin film may be subjected to, for example, a chemical vapor deposition process, an organic metal chemical vapor deposition process, a liquid phase epitaxy process, a sol-gel process, a sputtering process, a pulsed laser deposition process, or a combination thereof, and subsequently subjected to surface modification of the dielectric monolayer thin film. The surface modification of the dielectric monolayer thin film may be a step of treating the dielectric monolayer thin film with UV and reactive gas.

In an embodiment, the dielectric monolayer thin film may not exhibit a C—H absorption peak in a wave number region of about 2800 cm$^{-1}$ to 3200 cm$^{-1}$, and may exhibit an O—H absorption peak in a wave number region of about 3250 cm$^{-1}$ to about 3800 cm$^{-1}$, as measured by infrared spectroscopy. The absence of such a C—H absorption peak is due to the removal of organic substance from the surface of the dielectric monolayer thin film. However, the O—H absorption peak may appear in the dielectric monolayer thin film.

The oxide included in a dielectric may have a band gap of about 3 eV or greater, for example, about 4 eV or greater. When the band gap of the oxide is too small, the dielectric may have reduced resistivity, and thus the capacitor may have reduced resistance. When the band gap of the oxide is too large, it may be difficult to match the dielectric with an electrode.

In an embodiment of the dielectric monolayer thin film, a carbon content may be about 1% or less, for example, 0.5% or less, as measured by liquid chromatography. Like this, since the organic substance is substantially removed from the dielectric monolayer thin film, the carbon content may be very low.

In an embodiment, since the capacitor includes the above-described dielectric monolayer thin film, the capacitor may have an increased capacitance, and a reduced leakage current. The types of the capacitor comprising the dielectric monolayer thin film are not specifically limited. The capacitor may be, for example, a capacitor element included in a memory cell, or a stacked capacitor used in a stacked ceramic condenser.

Figure 2A:
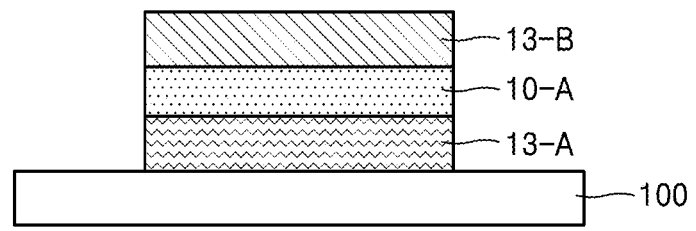
FIGS. 2A to 2D are schematic views of capacitors according to embodiments.

FIG. 2A illustrates a structure of a capacitor including the dielectric monolayer thin film according to any of the above-described embodiments. Referring to FIG. 2A, the capacitor may include an insulating substrate 100, a first electrode 13-A, a dielectric monolayer thin film 10-A, and a second electrode 13-B. The first electrode 13-A and the second electrode 13-B may serve as a lower electrode and an upper electrode, respectively. The first electrode 13-A and the second electrode 13-B may not electrically contact each other, and the dielectric monolayer thin film 10-A, as described above, may be arranged between the first electrode 13-A and the second electrode 13-B.

Figure 2B:
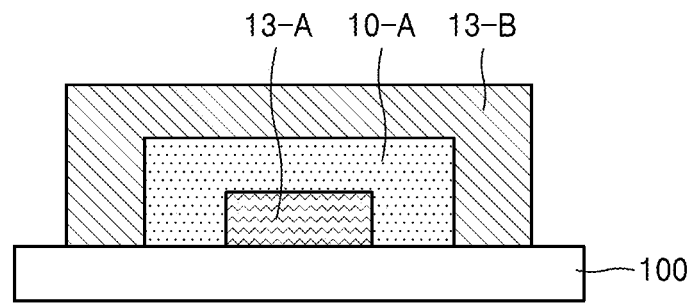
Figure 2C:
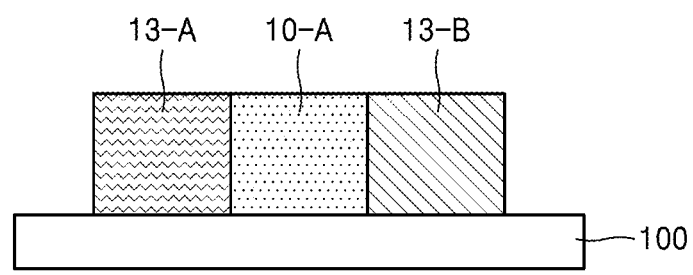
Figure 2D:
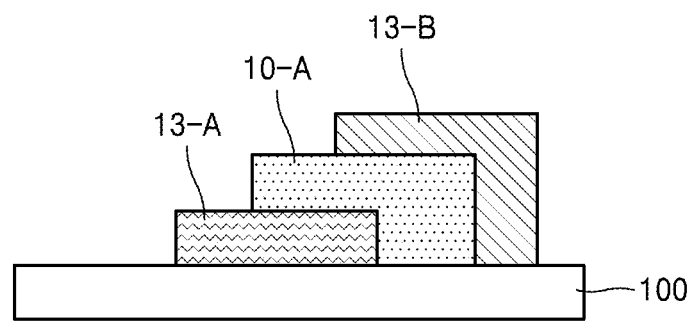

FIGS. 2B to 2D illustrate different structures of capacitors including the above-described dielectric monolayer thin film according to embodiments. Referring to FIG. 2B, a dielectric monolayer thin film 10-A may be arranged so as to cover a first electrode 13-A on an insulating substrate 100, and a second electrode 13-B may be arranged so as to cover the dielectric monolayer thin film 10-A. Referring to FIG. 2C, a first electrode 13-A and a second electrode 13-B may be arranged on an insulating substrate 100, and a dielectric monolayer thin film 10-A may be arranged between the first electrode 13-A and the second electrode 13-B. Referring to FIG. 2D, a dielectric monolayer thin film 10-A may be arranged so as to cover part of a first electrode 13-A on an insulating substrate 100, and a second electrode 13-B may be arranged so as to cover part of the dielectric monolayer thin film 10-A. The dielectric monolayer thin film 10-A according to the above-described embodiments may exhibit improved dielectric properties. The dielectric properties may be such that the polarization generated by the application of an electric field is maintained even when the electric field is zero (0), and the polarization direction is reversed by application of an electric field (e.g., polarization reversal).

The dielectric monolayer thin film 10-A may be formed using, for example, a chemical vapor deposition process, an organic metal chemical vapor deposition process, a liquid phase epitaxy process, a sol-gel process, a sputtering process, or a pulsed laser deposition process.

The first electrode 13-A and the second electrode 13-B may each independently include, for example, strontium-ruthenium oxide ($SrRuO_3$), iridium-ruthenium oxide ($SrIrO_3$), calcium-ruthenium oxide ($CaRuO_3$), calcium-nickel oxide ($CaNiO_3$), barium-ruthenium oxide ($BaRuO_3$), barium-strontium-ruthenium oxide (($Ba,Sr)RuO_3$), iridium (Ir), an iridium-ruthenium alloy (IrRu), iridium oxide ($IrO_2$), a titanium-aluminum nitride (TiAlN), titanium oxide ($TiO_2$), ruthenium (Ru), platinum (Pt), zirconium oxide ($ZrO_2$), tin oxide ($SnO_2$), indium-tin oxide (ITO), or a combination thereof. However, embodiments are not limited thereto. Any electrode material available in the art may be used. These materials may be used alone or in combination.

The first electrode 13-A and the second electrode 13-B may each independently formed by deposition of metal, metal oxide, metal nitride, metal nitrate, or a metal alloy using an electron-beam deposition process, a chemical vapor deposition process, a sputtering process, an atomic layer deposition process, or a pulsed laser deposition process. The first electrode 13-A and the second electrode 13-B may have a single layer structure or a multilayer structure.

In other embodiments, the first electrode 13-A and the second electrode 13-B may be formed by coating a preceding layer and/or element with an electrode paste including a conductive material, drying the paste to obtain a coating film, and thermally treating the coating film.

Since the coating method does not use a vacuum process or a high temperature process, it is possible to form the first electrode 13-A and the second electrode 13-B simply.

The electrode paste may include, for example, conductive material particles, an organic component, and a solvent.

The conductive material may be any material which is generally used in electrodes. The conductive material may be, for example, conductive metal oxides (e.g., tin oxide, indium oxide, or indium tin oxide (ITO)); metals (e.g., platinum, gold, silver, copper, iron, tin, zinc, aluminum, indium, chromium, lithium, sodium, potassium, cesium, calcium, magnesium, palladium, molybdenum, amorphous silicon, polysilicon, and/or alloys thereof); inorganic conductive materials (e.g., copper iodide or copper sulfide); and/or a conductive polymer (e.g., polythiophene, polypyrrole, polyaniline, a complex of polyethylene dioxythiophene and polystyrene sulfonic acid). The conductive material may be a doped material, for example, the conductive polymer may be doped with iodine, or a carbonaceous material. These conductive materials may be used alone, or a plurality of these materials may be stacked or mixed.

The conductive material may be metal particles. By using metal particles, the capacitor may have improved resistance to failure from bending, or an increase in coercive electric field may not occur even with repeated application of a voltage. Metal particles may also improve the adhesion between the electrode and the dielectric monolayer thin film, due to an anchor effect caused by the formation of unevenness on the surface of a conductive film and the arrangement of a dielectric monolayer thin film on the unevenness of the conductive film. The metal particles may include, for example, at least one of gold, silver, copper, platinum, lead, tin, nickel, aluminum, tungsten, molybdenum, ruthenium oxide, chromium, titanium, carbon, and indium.

According to another aspect of the present disclosure, provided is a semiconductor device including the dielectric monolayer thin film according the example embodiments. The semiconductor device may provide excellent physical properties by including the dielectric monolayer thin film according the example embodiments.

The semiconductor device may be, for example, a memory device.

Figure 3A:
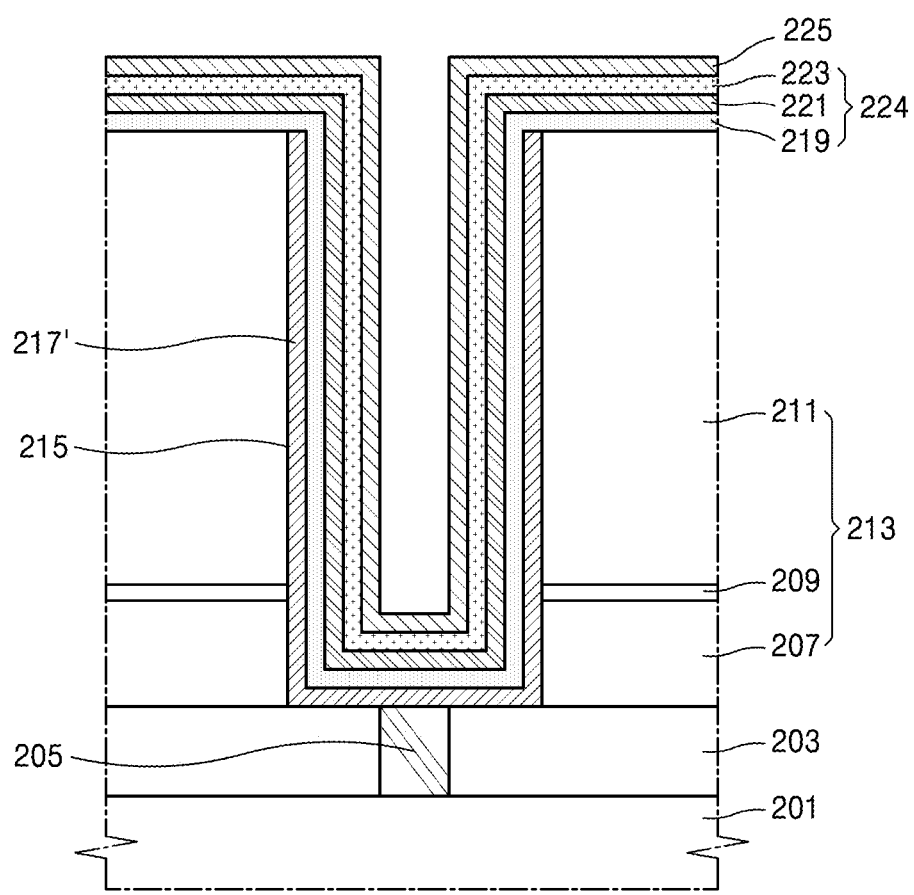
FIG. 3A is a cross-sectional view illustrating a structure of a metal-insulator-metal (MIM) capacitor according to an embodiment.

FIG. 3A illustrates a structure of a metal-insulator-metal (MIM) capacitor according to an embodiment.

An interlayer insulating film 203 may be stacked on a semiconductor substrate 201. A contact plug 205 may be formed to fill a contact hole through which the semiconductor substrate 201 is exposed. A mold insulating film 213 may be formed on the semiconductor substrate having the contact plug 205. As illustrated in FIG. 3A, the mold insulating film 213 may have a structure in which a lower mold insulating film 207, an etch stop film 209, and an upper mold insulating film 211 are sequentially stacked on the semiconductor substrate having the contact plug 205. However, the example embodiments are not so limited, for example the etch stop film 209 may be formed directly on an upper surface of the contact plug 205 and the interlayer insulating film 203. In other embodiments, the mold insulating film 213 may be formed as a double-layered mold insulating film including the lower mold insulating film 207 and the upper mold insulating film 211, or as a single mold insulating film. The lower mold insulating film 207 and the upper mold insulating film 211 may have an etch selectivity with respect to the etch stop film 209. For example, when the lower mold insulating film 207 and the upper mold insulating film 211 are formed of a silicon oxide film, the etch stop film 209 may be formed of a silicon nitride film. A storage node hole 215 which exposes the upper surface of the contact plug 205 and the upper surface of the interlayer insulating film 203 adjacent to the contact plug 205 may be formed by patterning the mold insulating film 213.

A conductive film may be formed on the entire surface of the semiconductor substrate having the storage node hole 215. The conductive film may be formed as a conductive film having excellent step coverage, resistance to deformation during a subsequent dielectric film forming process, and resistance to oxidation. For example, the conductive film may be formed of at least one metal nitride film (e.g., a titanium nitride film (TiN), a titanium silicon nitride film (TiSiN), a titanium aluminum nitride film (TiAlN), a tantalum nitride film (TaN), a tantalum silicon nitride film (TaSiN), a tantalum aluminum nitride film (TaAlN), and a tungsten nitride film (WN)). The conductive film may be etched to be isolated in the storage node hole 150, forming a lower electrode 217'.

A buffer insulating film (not illustrated) may also be formed on the lower electrode conductive film. The lower electrode 217' isolated in the storage node hole 215, and a buffer insulating film pattern isolated in the storage node hole 215 may be formed. The buffer insulating film pattern may be selectively removed to have a structure exposing the inner wall of the lower electrode. A dielectric film 224 in which a lower dielectric film 219 and an upper dielectric film 223 are sequentially stacked on the entire surface of the semiconductor substrate 201 having the lower electrode 217' may be formed. The lower dielectric film 219 and the upper dielectric film 223 may be the dielectric monolayer thin film according to any of the embodiments. In particular, the upper dielectric film 223 may be formed of a high-dielectric film having a higher dielectric constant than that of the lower dielectric film 219. Furthermore, the lower dielectric film 219 may be formed of a dielectric film having a larger energy band gap than that of the upper dielectric film 223.

An upper electrode 225 may be formed on the upper dielectric film 223. The upper electrode 225 may be formed of a metal film having a larger work function than that of the lower electrode 217'.

For example, the upper electrode 225 may be formed of at least one noble metal film (e.g., a Ru film, a Pt film, and/or an Ir film), a $Ta_2O_5$ film, a $TiO_2$ film, a doped $TiO_2$ film, and/or a STO film. The lower dielectric film 219 may be formed of at least one of a $HfO_2$ film, a $ZrO_2$ film, an $Al_2O_3$ film, and/or a $La_2O_3$ film.

An intermediate dielectric film 221 may be interposed between the lower dielectric film 219 and the upper dielectric film 223. The lower dielectric film 219, the intermediate dielectric film 221, and the upper dielectric film 223 may each be formed of a crystalline or amorphous dielectric film. The intermediate dielectric film 221 may be the dielectric monolayer thin film according to the example embodiments.

In other embodiments, the intermediate dielectric film 221 may comprise a crystalline or amorphous structure formed of at least one of a $HfO_2$ film, a $ZrO_2$ film, an $Al_2O_3$ film, a $La_2O_3$ film, a $Ta_2O_5$ film, a TiO film, a doped TiO film, and/or a STO film. The upper dielectric film 221 may comprise a crystalline or amorphous structure formed of at least of a $Ta_2O_5$ film, a TiO film, a doped TiO film, and/or a STO film. Like this, by forming the intermediate dielectric film 221 as a dielectric film having a crystalline or amorphous structure, the dielectric film 224 may have improved breakdown voltage characteristics. For example, when the lower dielectric film 219 and the upper dielectric film 223 are formed of a dielectric film having a crystalline structure, breakdown voltage characteristics of the lower dielectric film 219 and the upper dielectric film 223 may be improved, while leakage current characteristic thereof may be deteriorated. Accordingly, by forming, as a dielectric film having an amorphous structure, the intermediate dielectric film 221 between the lower dielectric film 219 and the upper dielectric film 223, a capacitor having excellent electrical characteristics such as leakage current characteristics and breakdown voltage characteristics may be provided.

The MIM capacitor of FIG. 3A may have a concave structure or a cylindrical structure.

Figure 3B:
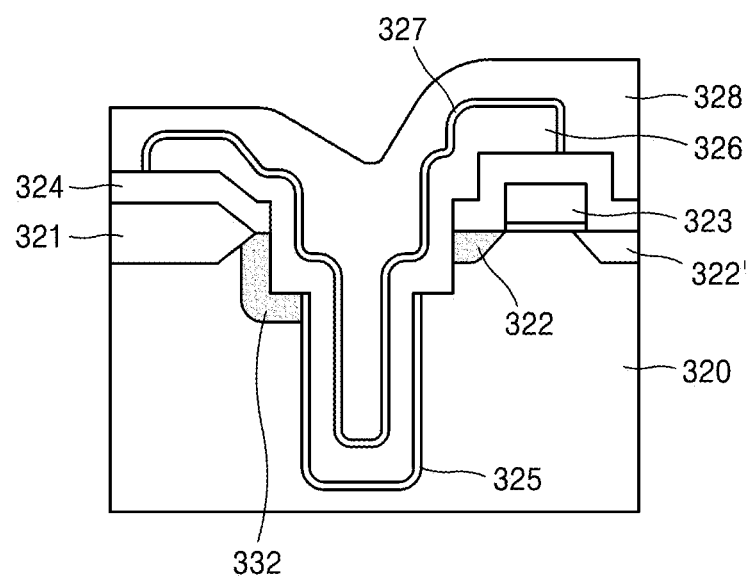
FIG. 3B illustrates a structure of a trench capacitor-type dynamic random-access memory (DRAM) according to an embodiment.

FIG. 3B illustrates a structure of a trench capacitor-type dynamic random access memory (DRAM).

Referring to FIG. 3B, on a P-type semiconductor substrate 320, a device isolation region may be defined with a field oxide film 321, and a gate electrode 323 and source/drain impurity regions 222 and 222' may be formed in the device isolation region. A high-temperature oxide (HTO) film may be formed as an interlayer insulating film 324. A region not to be a trench may be capped with a trench buffer layer, and a part of the source region 322 may be open to form a contact portion.

A trench is formed in a sidewall of the interlayer insulating film 324, and a sidewall oxide film 325 may be formed over the entire sidewall of the trench. The sidewall oxide film 325 may compensate for damage in the semiconductor substrate caused by etching to form the trench, and may also serve as a dielectric film between the semiconductor substrate 320 and a storage electrode 326. A sidewall portion of part of the source region 322, except for the other part of the source region near the gate electrode 323, may be entirely exposed.

A PN junction (not illustrated) may be formed in the sidewall portion of the source region by impurity implantation. The trench may be formed in the source region 322. A sidewall of the trench near the gate may directly contact the source region 322, and the PN junction may be formed by additional impurity implantation into the source region.

A storage electrode 326 may be formed on part of the interlayer insulating film 324, the exposed source region, and the surface of the sidewall oxide film 325 in the trench. The storage electrode may be, for example, a polysilicon layer, and may be formed so as to contact the entire source region 322 in contact with the upper sidewall of the trench, in addition to the part of the source region 322 near the gate electrode. The source region 322 on the outer surface of the upper sidewall of the trench may be enlarged due to the implanted impurities, and thus may more reliably contact the storage electrode 326. Next, an insulating film 327 as a capacity dielectric film may be formed along the upper surface of the storage electrode 326, and a polysilicon layer as a plate electrode 328 may be formed thereon, thereby completing a trench capacitor type DRAM. The dielectric monolayer thin film according to any of the embodiments may be used as the insulating film 327.

As the storage electrode 326, the polysilicon layer may be formed on the part of the interlayer insulating film 324, the exposed source region 322, and the surface of the sidewall oxide film 325 in the trench. Since the storage electrode 326 is formed to spontaneously contact, in addition to the part of the source region 322 near the gate electrode, the entire source region 322 in contact with the upper sidewall of the trench, the contact area may be enlarged, leading to more reliable contact with the storage electrode 326 and a significant increase in capacitance of the capacitor.

Figure 4:
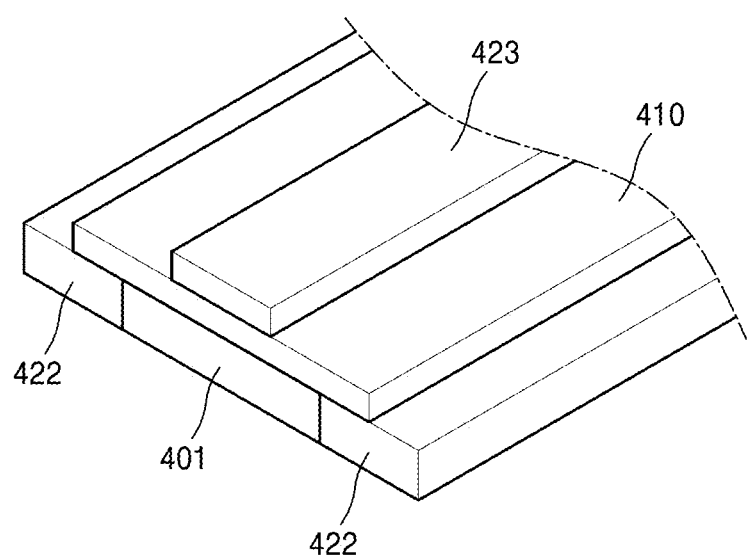
FIG. 4 illustrates a structure of a transistor.

FIG. 4 illustrates a structure of a transistor.

Referring to FIG. 4, the transistor may comprise a gate electrode 423, a gate dielectric 410, a channel region 401, and source/drain regions 422. The transistor may be, for example, a thin film transistor comprising thin film material structures, for example graphene and/or molybdenum disulfide ($MoS_2$).

The transistor may be grown and/or formed on a substrate (not illustrated). The substrate may be, for example, a semiconductor substrate (e.g., silicon), an insulator (e.g., $SiO_2$ and/or glass), a Silicon-on-insulator (SOI), a carbon based material, or the like. Though not illustrated as such, the substrate may also be a component of the transistor, for example the gate electrode 423.

The source/drain regions 422 may be a conductive material. The source/drain regions 422 may be, for example, a conductive material. The conductive material comprising each of the source/drain regions 422 may be, for example, a conductive metal oxide (e.g., tin oxide, indium oxide, and/or indium tin oxide (ITO)); a metal (e.g., platinum, gold, silver, copper, iron, tin, zinc, aluminum, indium, chromium, lithium, sodium, potassium, cesium, calcium, magnesium, palladium, molybdenum, amorphous silicon, polysilicon, and/or alloys thereof); inorganic conductive materials (e.g., copper iodide and/or copper sulfide); and/or a conductive carbon-based material (e.g., graphene, carbon nanotubes, polythiophene, polypyrrole, polyaniline, a complex of polyethylene dioxythiophene and/or polystyrene sulfonic acid).

The transistor may have a channel region 401. The channel region may comprise a semiconductor material like modified graphene, $MoS_2$, and/or Silicon. The channel region 401 may be between the source/drain regions 422, and may electrically connect the source/drain regions when a voltage and/or current is applied to the gate electrode 423. For example, when the source/drain regions 422 are graphene, the channel region 401 may comprise graphene formed under the same process as the source/drain regions 422 and modified to be a semiconductor. In another embodiment, the channel region 401 may be a thin-film and/or 2-dimensional semiconductor, like $MoS_2$ deposited between graphene nanoribbons.

The gate dielectric 410 may separate and insulate the channel region 401 from the gate electrode 423. The gate electrode 423 may be a conductive material. The gate electrode 423 may be the same conductive material as the source/drain regions 422 or may be a different conductive material.

The gate dielectric 410 may comprise the dielectric monolayer thin film according to the example embodiments. In an example embodiment, the gate dielectric 410 may comprise an upper and lower dielectric (not illustrated) comprising a crystalline structure and an intermediate layer (not illustrated) comprising an amorphous structure, thus providing a gate dielectric with good breakdown voltage and leakage current characteristic.

Though the transistor is illustrated as a top-gate transistor, the embodiments are not so limited, and may comprise other configurations of transistors without limiting the scope of the present disclosure.

One or more embodiments of the present disclosure will now be described in detail with reference to the following examples. However, these examples are only for illustrative purposes and are not intended to limit the scope of the one or more embodiments of the present disclosure.

Preparation of Dielectrics

Preparation Example 1: Preparation of $KSr_2Nb_3O_{10}$ and $KSr_2NaNb_4O_{13}$

After $K_2CO_3$, $Sr_2CO_3$, and $Nb_2O_5$ were mixed in a molar ratio of about 1.1:2:3, ethanol and zirconia balls were put thereinto, and then subjected to ball milling under air atmosphere at room temperature (25° C.) for about 24 hours to prepare a mixture. The prepared mixture was dried at about 100° C. for 1 day to obtain a dried powder. The amounts of $K_2CO_3$, $Sr_2CO_3$, and $Nb_2O_5$ were stoichiometrically controlled so as to obtain $KSr_2Nb_3O_{10}$.

The dried powder was put into an alumina crucible and then thermally treated (primary thermal treatment) under atmospheric condition at about 1200° C. for about 12 hours to obtain $KSr_2Nb_3O_{10}$.

After the primary thermal treatment, $NaNbO_3$ was added to $KSr_2Nb_3O_{10}$ in a molar ratio of 1:1, ethanol and zirconia balls were put thereinto, and then subjected to ball milling under air atmosphere at room temperature for about 24 hours to prepare a mixture. The prepared mixture was dried to obtain dried powder. The dried powder was put into an alumina crucible and then thermally treated (secondary thermal treatment) under atmospheric condition at about 1300° C. for about 24 hours to obtain $KSr_2NaNb_4O_{13}$. A small amount of $KSr_2Nb_3O_{10}$, in addition to $KSr_2NaNb_4O_{13}$, remained in the resulting product.

$NaNbO_3$ was added to the resulting product and then thermally treated (tertiary thermal treatment) under atmospheric condition at about 1300° C. for about 24 hours to obtain a target product $KSr_2NaNb_4O_{13}$.

The amounts of $KSr_2Nb_3O_{10}$ and $NaNbO_3$ were stoichiometrically controlled so as to obtain the target product $KSr_2NaNb_4O_{13}$.

Preparation Example 2: Preparation of $KSr_2Na_2Nb_5O_{16}$ $KSr_2Nb_3O_{10}$ was prepared in the same manner as in Preparation Example 1.

After, NaNbO was added to $KSr_2Nb_3O_{10}$ in a molar ratio of 1:2, ethanol and zirconia balls were put thereinto, and subjected to ball milling under air atmosphere at room temperature for about 24 hours to prepare a mixture. The prepared mixture was dried to obtain a dried powder. The dried powder was put into an alumina crucible and then thermally treated (secondary thermal treatment) under atmospheric condition at about 1300° C. for about 24 hours to obtain $Sr_2Na_2Nb_5O_{16}$. A small amount of $KSr_2NaNb_4O_{13}$ was contained in the resulting product.

$NaNbO_3$ was added to the resulting product and then thermally treated (tertiary thermal treatment) under atmospheric condition at about 1300° C. for about 24 hours to obtain a target product $KSr_2Na_2Nb_5O_{16}$.

The amounts of $KSr_2Nb_3O_{10}$ and $NaNbO_3$ were stoichiometrically controlled to obtain the target product $KSr_2Na_2Nb_5O_{16}$.

(Manufacture of Dielectric Monolayer Thin Film and Capacitor)

Figure 5:
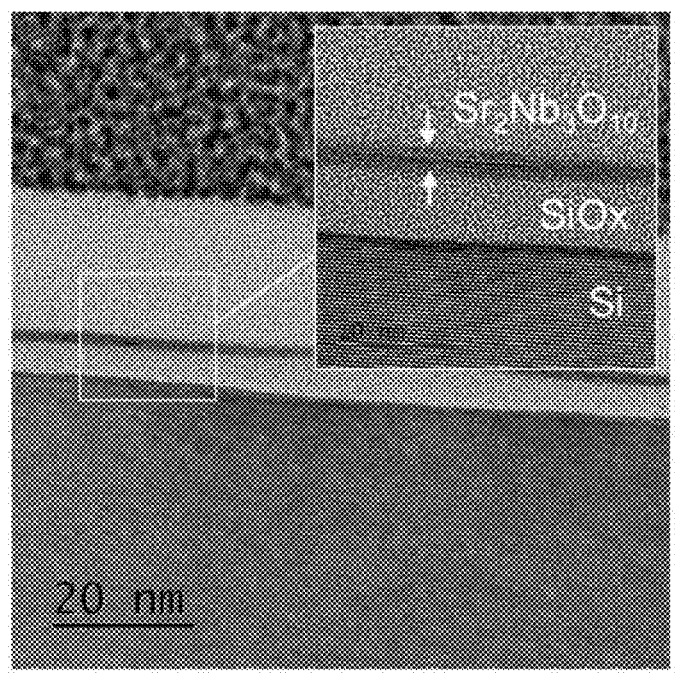
FIG. 5 is a transmission electron microscope (TEM) image showing a structure of a dielectric monolayer thin film formed on a substrate according to Example 1.

FIG. 5 is a transmission electron microscope (TEM) image showing a structure of a dielectric monolayer thin film formed on a substrate according to Example 1.

Example 1

5 g of $KSr_2Nb_3O_{10}$, obtained in Preparation Example 1, was added to 200 ml of a 5 M $HNO_3$ aqueous solution, and then reacted for about 72 hours to substitute potassium ions ($K^+$) with hydrogen ions ($H^+$) and/or hydronium ions ($H_3O^+$). Subsequently, the reaction product was neutralized with distilled water, and fully dried in the air and then in an oven for 1 day or longer. 0.4 g of the hydrogen-substituted $HSr_2Nb_3O_{10} \cdot 1.5H_2O$ was immersed in a tetrabutylammonium hydroxide solution (TBAOH) to substitute hydrogen ions ($H^+$) and/or hydronium ions ($H_3O^+$) with tetrabutylammonium (TBA) ions, and induce exfoliation into a plurality of nanosheets. At this time, $HSr_2Nb_3O_{10} \cdot 1.5H_2O$ and TBAOH were mixed in a molar ratio of 1:1. After the exfoliation was performed at room temperature for 14 days, the resulting product was centrifuged at 2,000 rpm for 30 minutes to isolate the supernatant (2/3). Only the supernatant was used, and the precipitate residue was discarded. Subsequently, the centrifuged supernatant was subjected to dialysis through a membrane to prepare a nanosheet solution.

A lower electrode, a Pt electrode, was formed on a Si substrate having $SiO_2$ and $TiO_2$ stacked thereon, to a thickness of about 200 nm by sputtering. Subsequently, the nanosheet solution obtained above was coated on the lower electrode using a Langmuir-Blodgett method and KSV NIMA Langmuir Trough at a substrate rise rate of about 0.5 mm/min and a surface pressure of 12 mN/m to form a two-dimensional nanosheet monolayer.

$UV/O_3$ treatment was performed on the two-dimensional nanosheet monolayer by supplying oxygen ($O_2$) at about 500 sccm and radiating UV light of about 365-nm wavelength using a UV lamp (at about 320 W) for about 24 hours, to form a hydrogen (H)-terminated $Sr_2Nb_3O_{10}$ dielectric monolayer thin film having a thickness of about 1.5 nm.

Subsequently, a Pt electrode was then formed on the dielectric monolayer thin film to thereby manufacture a capacitor.

Example 2

A H-terminated $Sr_2NaNb_4O_{13}$ dielectric monolayer thin film (having a thickness of about 2.8 nm) and a capacitor including the same were manufactured in the same manner as in Example 1, except that $KSr_2NaNb_4O_{13}$ obtained in Preparation Example 1, instead of $KSr_2Nb_3O_{10}$, was used.

Example 3

A H-terminated $Sr_2Na_2Nb_5O_{16}$ dielectric monolayer thin film (having a thickness of about 3.2 nm) and a capacitor including the same were manufactured in the same manner as in the same manner as in Example 1, except that $KSr_2Na_2Nb_5O_{16}$ obtained in Preparation Example 2, instead of $KSr_2Nb_3O_{10}$ prepared in Preparation Example 1, was used.

Comparative Example 1

A dielectric monolayer thin film and a capacitor including the same were manufactured in the same manner as in Example 1, except that $UV/O_3$ treatment was not performed after the formation of the two-dimensional nanosheet monolayer.

Comparative Example 2

5 g of $KSr_2Nb_3O_{10}$ obtained in Preparation Example 1 was added to 200 ml of a 5 M $HNO_3$ aqueous solution, and then reacted for about 72 hours to substitute potassium ions (K$^+$) with hydrogen ions (H$^+$) and/or hydronium ions (H$_3$O$^+$). Subsequently, the reaction product was neutralized with distilled water, and fully dried in the air and then in an oven for 1 day or longer. 0.4 g of the hydrogen-substituted HSr$_2$Nb$_3$O$_{10}$·1.5H$_2$O was immersed in a tetrabutylammonium hydroxide solution (TBAOH) to substitute hydrogen ions (H$^+$) and/or hydronium ions (H$_3$O$^+$) with tetrabutylammonium (TBA) ions, and induce exfoliation into a plurality of nanosheets. At this time, HSr$_2$Nb$_3$O$_{10}$·1.5H$_2$O and TBAOH were mixed in a molar ratio of 1:1. After the exfoliation was performed at room temperature for 14 days, the resulting product was centrifuged at 2,000 rpm for 30 minutes to isolate the supernatant (2/3). Only the supernatant was used, and the precipitate residue was discarded. Subsequently, the centrifuged supernatant was subjected to dialysis through a membrane to prepare a nanosheet solution.

A lower electrode, a Pt electrode. was formed on a Si substrate having SiO$_2$ and TiO$_2$ stacked thereon, to a thickness of about 200 nm by sputtering. Subsequently, the nanosheet solution obtained above was coated on the lower electrode using a Langmuir-Blodgett method and KSV NIMA Langmuir Trough at a substrate rise rate of about 0.5 mm/min and a surface pressure of 12 mN/m to form a two-dimensional nanosheet monolayer.

The two-dimensional nanosheet monolayer obtained through the above-described process was treated with 5 mol % of HNO$_3$ at a temperature of about 80° C. for about 6 minutes to form a dielectric monolayer thin film and a capacitor including the same.

Comparative Example 3

A dielectric monolayer thin film and a capacitor including the same were manufactured in the same manner as in Comparative Example 2, except that the two two-dimensional nanosheet monolayer was treated with 5 mol % HNO$_3$, with UV of an about 365-nm wavelength using a UV lamp (at about 320 W).

Comparative Example 4

5 g of KSr$_2$Nb$_3$O$_{10}$ obtained in Preparation Example 1 was added to 200 ml of a 5 M HNO$_3$ aqueous solution, and then reacted for about 72 hours to substitute potassium ions (K$^+$) with hydrogen ions (H$^+$) and/or hydronium ions (H$_3$O$^+$). Subsequently, the reaction product was neutralized with distilled water, and fully dried in the air and then in an oven for 1 day or longer. 0.4 g of the hydrogen-substituted HSr$_2$Nb$_3$O$_{10}$·1.5H$_2$O was immersed in a tetrabutylammonium hydroxide solution (TBAOH) to substitute hydrogen ions (H$^+$) and/or hydronium ions (H$_3$O$^+$) with tetrabutylammonium (TBA) ions, and induce exfoliation into a plurality of nanosheets. At this time, HSr$_2$Nb$_3$O$_{10}$·1.5H$_2$O and TBAOH were mixed in a molar ratio of 1:1. After the exfoliation was performed at room temperature for 14 days, the resulting product was centrifuged at 2,000 rpm for 30 minutes to isolate the supernatant (2/3). Only the supernatant was used, and the precipitate residue was discarded. Subsequently, the centrifuged supernatant was subjected to dialysis through a membrane to prepare a nanosheet solution.

A lower electrode, a Pt electrode, was formed on a Si substrate having SiO$_2$ and TiO$_2$ stacked thereon, to a thickness of about 200 nm by sputtering. Subsequently, the nanosheet solution obtained above was coated on the lower electrode using a Langmuir-Blodgett method and KSV NIMA Langmuir Trough at a substrate rise rate of about 0.5 mm/min and a surface pressure of 12 mN/m to form a dielectric multilayer thin film including 10 to 20 layers.

Subsequently, a Pt electrode was then formed on the dielectric multilayer thin film to thereby manufacture a capacitor.

Comparative Example 5

UV/O$_3$ treatment was performed on the two-dimensional nanosheet multilayer thin film obtained in Comparative Example 2 by supplying oxygen (O$_2$) at about 500 sccm and radiating UV light of an about 365-nm wavelength using a UV lamp (at about 320 W) for about 24 hours, to form a Sr$_2$Nb$_3$O$_{10}$ dielectric multilayer thin film having a thickness of about 20 nm.

Subsequently, a Pt electrode was then formed on the dielectric multilayer thin film to thereby manufacture a capacitor.

Comparative Example 6

UV/O$_3$ treatment was performed on the two-dimensional nanosheet multilayer thin film obtained in Comparative Example 2 by supplying oxygen (O$_2$) at about 500 sccm and radiating UV light of an about 365-nm wavelength using a UV lamp (at about 320 W) for about 24 hours, to form a Sr$_2$Nb$_3$O$_{10}$ dielectric multilayer thin film having a thickness of about 25 nm.

Subsequently, a Pt electrode was then formed on the dielectric monolayer thin film to thereby manufacture a capacitor.

Evaluation Example 1: X-Ray Diffraction Analysis

Figure 6:
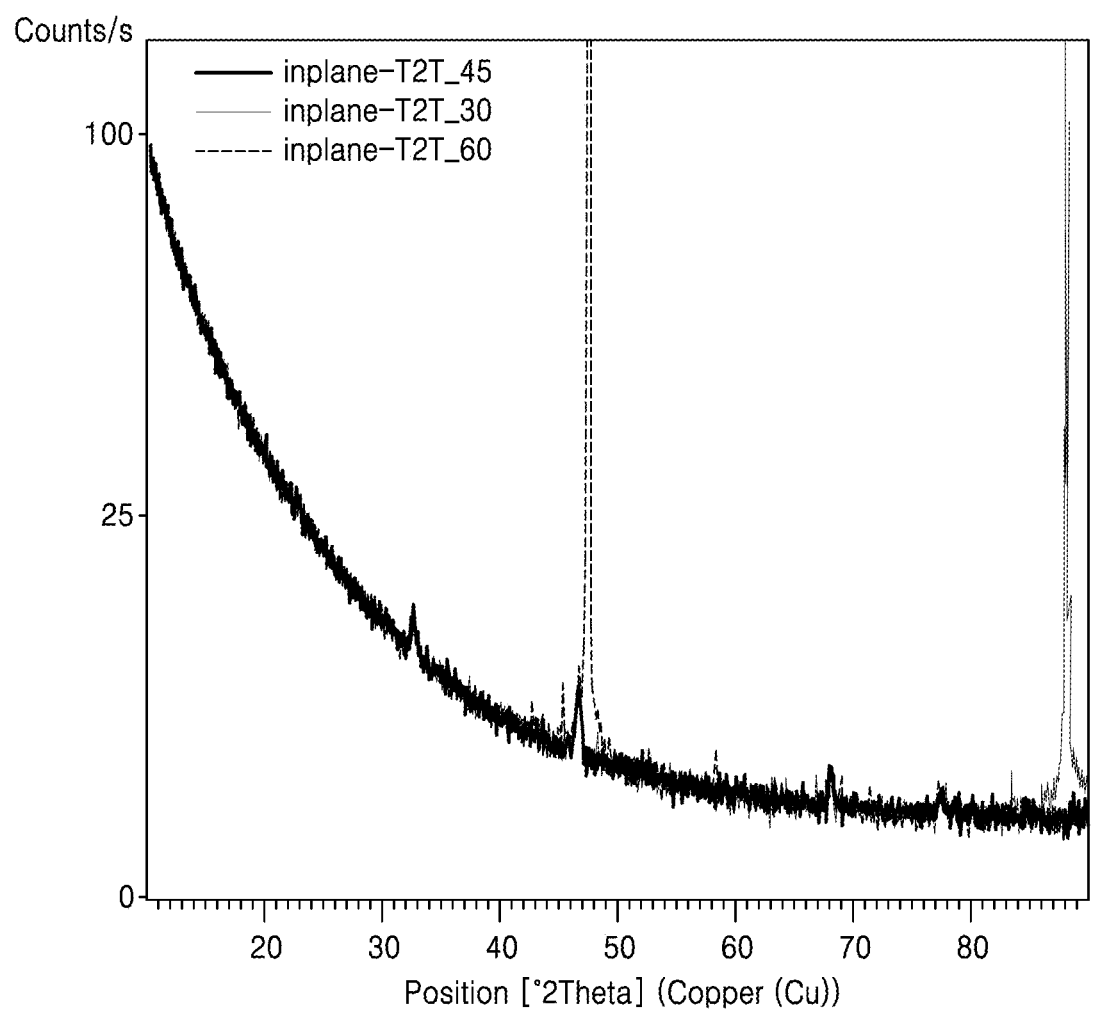
FIG. 6 illustrates X-ray diffraction (XRD) spectra of the dielectric monolayer thin film obtained in Example 1.

The KSr$_2$Nb$_3$O$_{10}$ dielectric monolayer thin film prepared in Example 1 was analyzed by X-ray diffractometry (XRD). The results are shown in FIG. 6. The XRD was performed using a Bruker's D8 Discover with Cu Kα radiation.

The dielectric monolayer thin film of Example 1 was found to include a Sr$_2$Nb$_3$O$_{10}$ single phase having perovskite crystalline structure as shown in FIG. 6.

Through crystal structure analysis, the oxides prepared in Examples 1 to 4 were found to have a structure belonging to the Pc2$_1$n space group which is a polar space group.

Evaluation Example 2: Dielectric Constant

The dielectric constants of the capacitors obtained in Example 1 to Example 3, Comparative Example 1, and Comparative Example 2 were measured at room temperature with a frequency range of 100 Hz to 100 kHz using an atomic force microscope (AFM, Bruker's Ico) and a P-E measurement equipment (Precision Multiferroic II available from Radiant Technologies, Inc.).

TABLE 1

| Example | Dielectric constant |
| --- | --- |
| Example 1 | 488 |
| Example 2 | 842 |
| Example 3 | 500 |
| Comparative Example 1 | 238 |
| Comparative Example 2 | 260 |

Referring to Table 1, the oxides of Examples 1 to 3 were found to have a high dielectric constant, while the oxide of Comparative Example 1 had a dielectric constant less than 300, and the oxide of Comparative Example 2, which was treated with nitric acid to remove organic substance, had a low dielectric constant of 260 or less.

Evaluation Example 3: Band Gap Evaluation

Figure 7A:
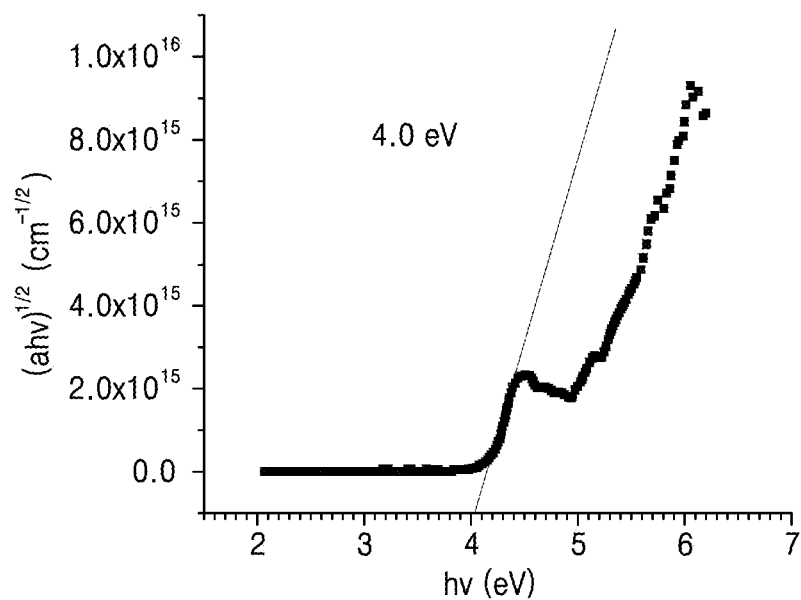
FIGS. 7A to 7C illustrates leakage current densities of capacitors manufactured in Examples 1 to 3, respectively.
Figure 7B:
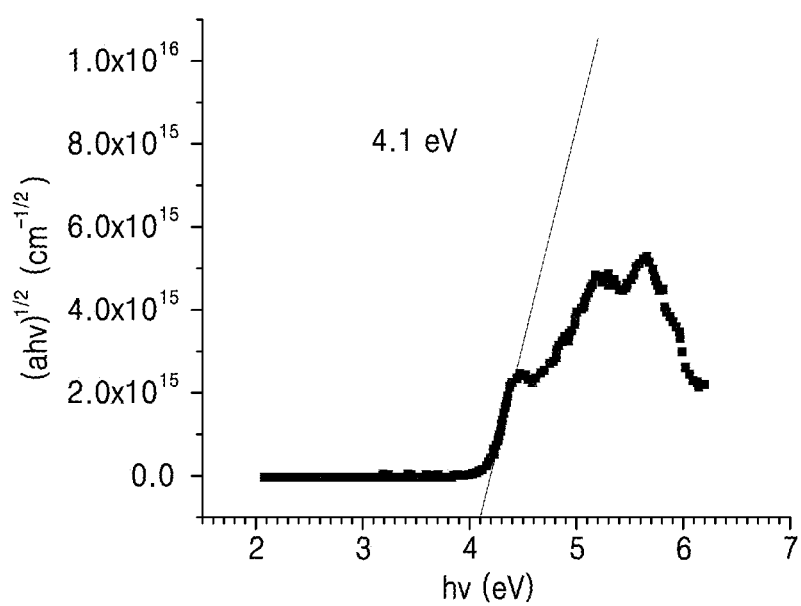
Figure 7C:
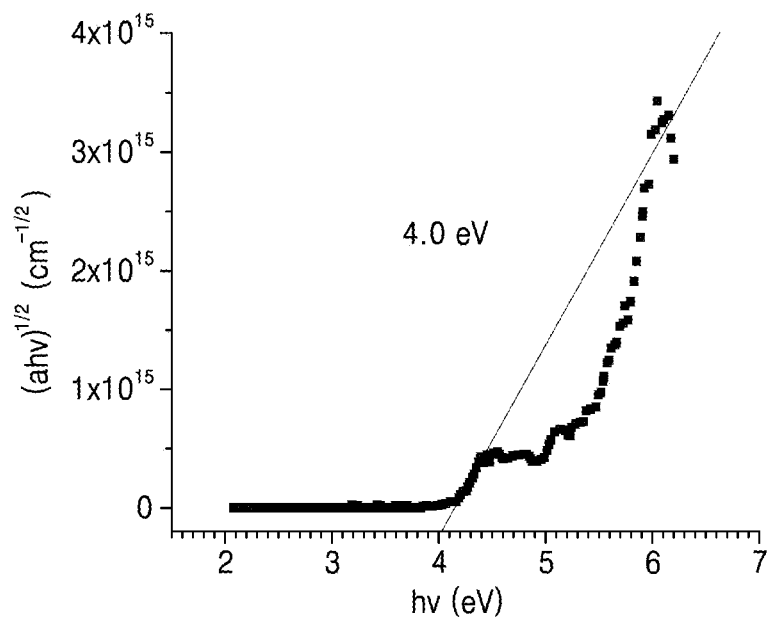

UV-Vis absorption spectra of the dielectric monolayer thin films formed in Examples 1 to 3 were measured and then converted using the equation of $\alpha h v = A(hv-Eg)^{1/2}$ into a graph of $(\alpha h v)^2$ with respect to hv. The results are shown in FIGS. 6A to 6C, with FIG. 7A representing Example 1, FIG. 7B representing Example 2, and FIG. 7C representing Example 3. Using the graphs obtained through the conversion of the absorption spectra, band gaps were obtained by slope extrapolation. The results are shown in Table 2. In the above conversion equation, A is the absorbance, a is the absorption coefficient, hv is the photon energy, and Eg is the band gap.

TABLE 2

| Example | Band gap (eV) |
| --- | --- |
| Example 1 | 4.0 |
| Example 2 | 4.1 |
| Example 3 | 4.0 |

Referring to Table 2 and FIGS. 7A to 7C, the dielectric monolayer thin films formed in Examples 1 to 3 were found to have a band gap of about 4.0 eV or greater. Since the dielectric monolayer thin films of Examples 1 to 3 have a band gap of 4.0 eV or greater, the dielectric monolayer thin films of Examples 1 to 3 are suitable for use as the dielectric layer of capacitors.

Evaluation Example 4: Leakage Current Density

Figure 8:
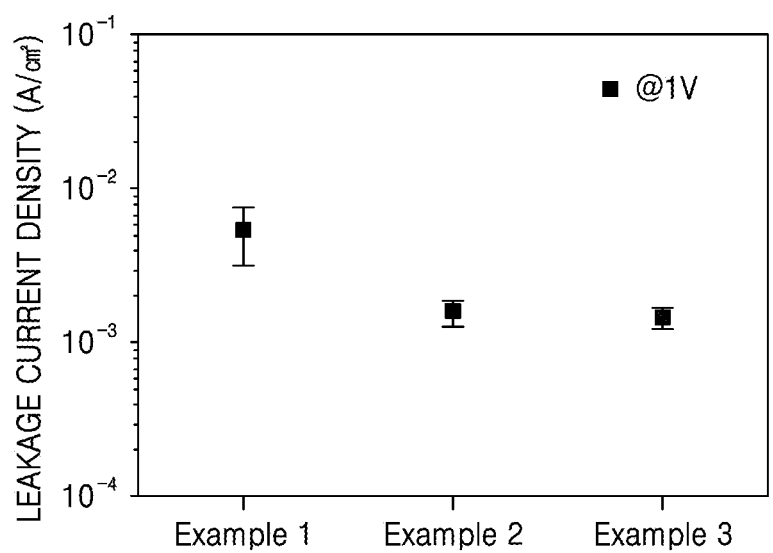
FIG. 8 illustrates the leakage current densities of capacitors manufactured in Examples 1 to 3.

Leakage current densities of the capacitors manufactured in Examples 1 to 3 when a voltage applied across the upper electrode and the lower electrode was less than 1V. The results are shown in FIG. 8.

The leakage current density is a current density flowing across a dielectric layer. Referring to FIG. 8, the capacitors manufactured in Examples 1 to 3 had reduced leakage current density. The capacitor of Example 4 exhibited the same leakage current density characteristics (not illustrated) as those of the capacitor of Example 1.

Evaluation Example 5: Infrared Spectroscopy

The dielectric monolayer thin films obtained in Example 1 and Comparative Example 1 were analyzed by infrared (IR) spectroscopy. The infrared spectroscopy was performed using a Varian 670-620 (Varian Technologies).

Figure 9:
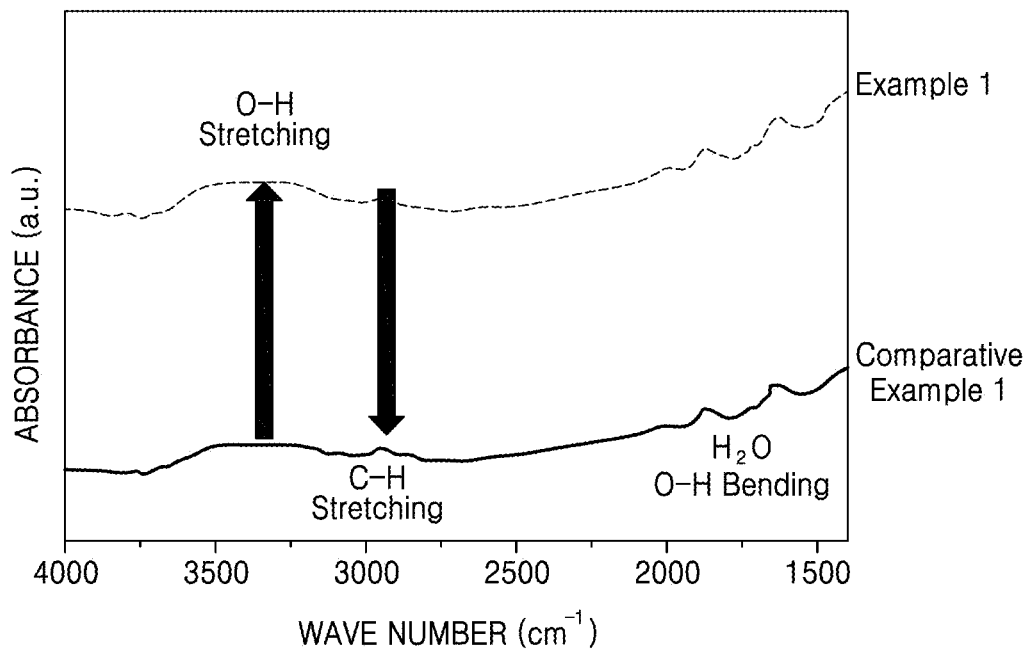
FIG. 9 illustrates the infrared (IR) spectra of dielectric monolayer thin films of Example 1 and Comparative Example 1.

The resulting IR spectra are shown in FIG. 9.

Referring to FIG. 9, in the dielectric monolayer thin film of Comparative Example 1, peaks attributable to C—H bonding and O—H bonding were observed in a wave number range of 1000 cm$^{-1}$ to 4000 cm$^{-1}$. Compared to this, in the dielectric monolayer thin film of Example 1, a peak attributable to C—H bonding was not observed, and a peak attributable to O—H bonding was observed in a wave number region of 3250 cm$^{-1}$ to 3800 cm$^{-1}$ and found to be increased. These results arise since the $Sr_2Nb_3O_{10}$ nanosheet, which has an anionic surface after the TBA organic substance is decomposed in a UV-ozone environment, is surface-modified with bound H$^+$ ions to maintain charge neutrality of the $Sr_2Nb_3O_{10}$ nanosheet.

Evaluation Example 6: Dielectric Constant

Figure 10:
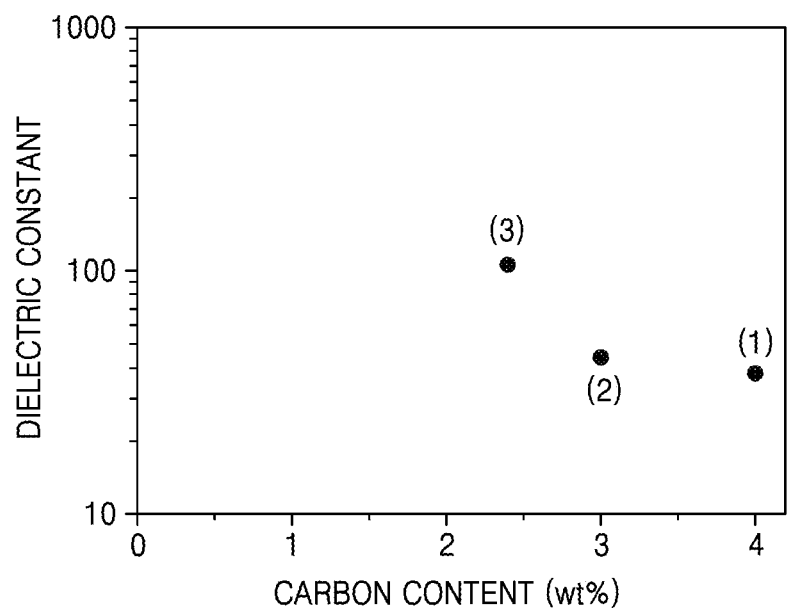
FIG. 10 is a graph illustrating change in dielectric constant with respect to the amount of organic substance in multilayer thin films prepared in Comparative Example 4 to Comparative Example 6.

Change in dielectric constant with respect to the amount of the organic substance in the multilayer thin films manufactured in Comparative Example 4 to Comparative Example 6 was evaluated. Change in dielectric constant with respect to the amount of the organic substance was evaluated using dielectric constants obtained using chromatography and an E4980A Precision LCR Meter (Keysight) used in Evaluation Example 7, which will be described later. The evaluation results are shown in FIG. 10. In FIG. 10, (1) denotes the multilayer thin film of Comparative Example 4 before the UV/O$_3$ treatment, (2) denotes the multilayer thin film of Comparative Example 5 after the UV/O$_3$ treatment, and (3) denotes the multilayer thin film of Comparative Example 6 after the UV/O$_3$ treatment and the thermal treatment.

Referring to FIG. 10, the multilayer thin film of Comparative Example 5 after the UV/O$_3$ treatment had a reduced amount of carbon as compared to that before the UV/O$_3$ treatment, but an insignificant change in dielectric constant. The amount of carbon may represent the presence of organic substances. The multilayer thin film of Comparative Example 6 after the UV/O$_3$ treatment and the heat treatment had a reduced amount of carbon and a higher dielectric constant. The multilayer thin films of Comparative Examples 4 to 6 were found to have degraded dielectric constant characteristics, as compared with those of the dielectric monolayer thin films of Examples 1 to 4.

Evaluation Example 7: Liquid Chromatography-Mass Spectrometry (LC-MS)

The dielectric monolayer thin film prepared in Example 1 was analyzed by liquid chromatography with respect to UV radiation time. The liquid chromatography was performed using a LCMS-IT-TOF (liquid chromatography-mass spectrometry-ion trap-time of flight) (available from Shimazu Corporation)

After 24 hours of UV irradiation, the amount of TBA organic substance on the $Sr_2Nb_3O_{10}$ dielectric monolayer thin film with respect to the amount of the TBA organic substance on the surface of the $Sr_2Nb_3O_{10}$ monolayer thin film before UV irradiation was investigated.

As a result of liquid chromatography analysis found that the amount of the organic substance after the UV radiation was significantly reduced, as compared with the amount of the organic substance before the UV radiation, and the amount of carbon in the finally obtained dielectric monolayer thin film was less than 1 wt %.

The two-dimensional nanosheet monolayer prepared in Comparative Example 2 was analyzed by LC-MS. The LC-MS was performed using a LCMS-IT-TOF (Shimazu Corporation). Samples of the $Sr_2Nb_3O_{10}$ thin film were analyzed by LC with a 5M-HNO$_3$ solvent after acid treatment for 24 hours, and then by MS for 10 minutes by irradiation with He plasma. The results of LC-MS are shown in FIG. 11.

Figure 11:
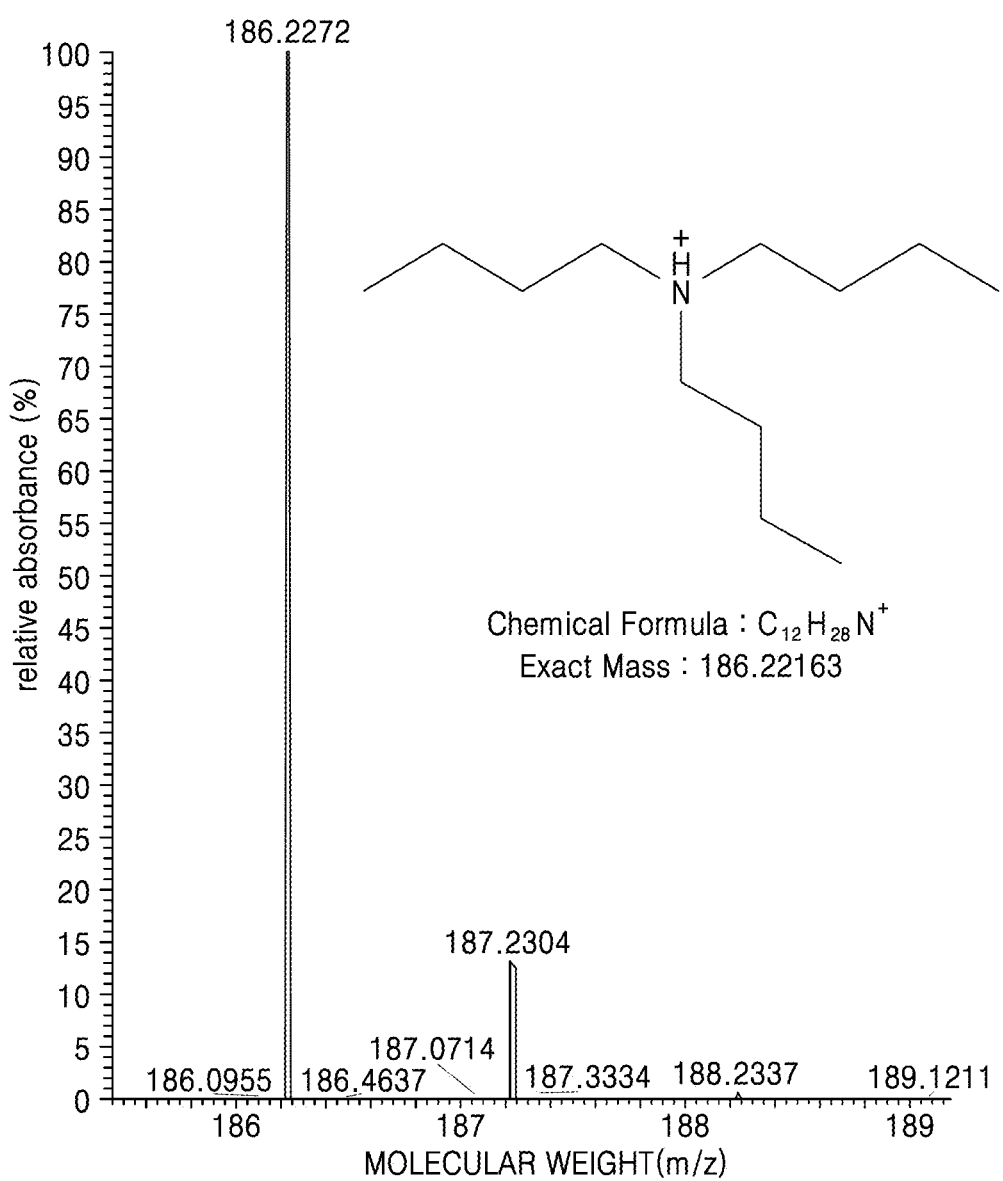
FIG. 11 illustrates the results of liquid chromatography-mass spectroscopy (LC-MS) of the two-dimensional nanosheet monolayer of Comparative Example 2.

As a result of the LC, after the treatment of the TBA-bound $Sr_2Nb_3O_{10}$ thin film with 5 mol. % nitric acid (HNO$_3$), as shown in FIG. 11, diethylheptylmethylazanium ($C_{12}H_{28}N^+$, molecular weight: 186.4 g/mol), as a modified form of TBA (($C_4H_9)_4$NOH) which initially had a molecular weight of 259.5 g/mol, was detected. From this, it was found that it is difficult to obtain, by removing the organic substance through acid treatment, a $HSr_2Nb_3O_{10}$ monolayer thin film as in Example 1 having a structure in which hydrogen is chemically bound to the surface of the two-dimensional nanosheet monolayer from which TBA is completely removed.

As described above, by employing a dielectric monolayer thin film according to the one or more embodiments, the capacity of a capacitor and the performance of a semiconductor device may be improved.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A dielectric monolayer thin film comprising:
an oxide represented by Formula 1, the oxide having a perovskite-type crystal structure and having a surface chemically bonded with hydrogen, $$A_2B_{n-3}C_nO_{3n+1} \qquad \text{<Formula 1>}$$

wherein, in Formula 1, A is a divalent element,
B is a monovalent element,
C is a pentavalent element, and
n is a number from 3 to 8.

2. The dielectric monolayer thin film of claim 1, wherein, in Formula 1, A is at least one of Ca, Sr, and Ba.

3. The dielectric monolayer thin film of claim 1, wherein, in Formula 1, B is at least one of Na, K, Rb, and Cs.

4. The dielectric monolayer thin film of claim 1, wherein, in Formula 1, C is at least one of V, Nb, and Ta.

5. The dielectric monolayer thin film of claim 1, wherein the oxide is a compound represented by Formula 2:

$$Sr_2Na_{n-3}Nb_nO_{3n+1} \qquad \text{<Formula 2>}$$

wherein, in Formula 2, n is 3, 4, 5, or 6.

6. The dielectric monolayer thin film of claim 1, wherein the dielectric monolayer thin film has a thickness of about 5 nm or smaller.

7. The dielectric monolayer thin film of claim 1, wherein the oxide represented by Formula 1 is at least one of $Sr_2Nb_3O_{10}$, $Sr_2NaNb_4O_{13}$, $Sr_2Na_2Nb_5O_{16}$, $Sr_2NaTa_4O_{13}$, $Sr_2Na_2Ta_5O_{16}$, $Sr_2KNb_4O_{13}$, $Sr_2K_2Nb_5O_{16}$, $Sr_2RbNb_4O_{13}$, $Sr_2Rb_2Nb_5O_{16}$, $Ca_2Nb_3O_{10}$, $Ca_2NaNb_4O_{13}$, $Ca_2Na_2Nb_5O_{16}$, $Ca_2KNb_4O_{13}$, $Ca_2K_2Nb_5O_{16}$, $Ca_2RbNb_4O_{13}$, $Ca_2Rb_2Nb_5O_{16}$, $Ca_2Ta_3O_{10}$, $Ca_2NaTa_4O_{13}$, $Ca_2Na_2Ta_5O_{16}$, $Ca_2KTa_4O_{13}$, $Ca_2K_2Ta_5O_{16}$, $Ca_2RbTa_4O_{13}$, $Ca_2Rb_2Ta_5O_{16}$, $Ba_2Nb_3O_{10}$, $Ba_2NaNb_4O_{13}$, $Ba_2Na_2Nb_5O_{16}$, $Ba_2KNb_4O_{13}$, $Ba_2K_2Nb_5O_{16}$, $Ba_2RbNb_4O_{13}$, $Ba_2Rb_2Nb_5O_{16}$, $Ba_2Ta_3O_{10}$, $Ba_2NaTa_4O_{13}$, $Ba_2Na_2Ta_5O_{16}$, $Ba_2KTa_4O_{13}$, $Ba_2K_2Ta_5O_{16}$, $Ba_2RbTa_4O_{13}$, and $Ba_2Rb_2Ta_5O_{16}$.

8. The dielectric monolayer thin film of claim 1, wherein the dielectric monolayer thin film has a dielectric constant of about 400 or greater at 100 KHz.

9. The dielectric monolayer thin film of claim 1, wherein the oxide having the surface chemically bonded with hydrogen has a band gap of about 3 eV or greater.

10. The dielectric monolayer thin film of claim 1, wherein the oxide having the surface chemically bonded with hydrogen does not exhibit a C—H absorption peak in a wave number region of about 2800 $cm^{-1}$ to 3200 $cm^{-1}$, and exhibits an O—H absorption peak in a wave number region of about 3250 $cm^{-1}$ to about 3800 $cm^{-1}$, as measured by infrared spectroscopy.

11. The dielectric monolayer thin film of claim 1, wherein the oxide having the surface chemically bonded with hydrogen has a carbon content of 1% or smaller, as measured by liquid chromatography.

12. A capacitor comprising:
a first electrode;
a second electrode; and
the dielectric monolayer thin film according to claim 1 between the first electrode and the second electrode.

13. A semiconductor device comprising the dielectric monolayer thin film according to claim 1.

14. A method of forming a dielectric monolayer thin film having a surface chemically bounded with hydrogen, the method comprising:
forming a dielectric monolayer thin film comprising an oxide which is represented by Formula 1 and a perovskite-type crystal structure; and
treating the dielectric monolayer thin film with UV and reactive gas, thereby forming the dielectric monolayer thin film including the oxide which is represented by Formula 1, has the perovskite-type crystal structure, and has a surface chemically bonded with hydrogen:

$$A_2B_{n-3}C_nO_{3n+1} \qquad \text{<Formula 1>}$$

wherein, in Formula 1, A is a divalent element, B is a monovalent element, C is a pentavalent element, and n is a number from 3 to 8.

15. The method of claim 14, wherein the reactive gas comprises at least one of ozone ($O_3$), oxygen ($O_2$), nitrogen dioxide ($NO_2$), dinitrogen oxide ($N_2O$), water vapor, air, hydrogen peroxide, methane, ethane, propane, butane, pentane, hexane, heptane, octane, and hydrogen sulfide.

16. The method of claim 14, wherein the reactive gas comprises at least one of ozone ($O_3$), and oxygen ($O_2$).

17. The method of claim 14, wherein the forming of the dielectric monolayer thin film comprising the oxide which is represented by Formula 1 and has the perovskite-type crystal structure comprises
forming a two-dimensional nanosheet monolayer including the oxide which is represented by Formula 1 and has the perovskite-type crystal structure; and
forming the dielectric monolayer thin film using the two-dimensional nanosheet monolayer.

18. The method of claim 17, wherein the forming the two-dimensional nanosheet monolayer comprises:
obtaining a layered proton-exchange ceramic material through proton-exchange reaction of a layered ceramic material represented by Formula 4; and
intercalating an intercalation material into the layered proton-exchange ceramic material to exfoliate a nanosheet therefrom, $$D[A_2B_{n-3}C_nO_{3n+1}] \qquad \text{<Formula 4>}$$

wherein, in Formula 4, A is the divalent element, B is the monovalent element, C is the pentavalent element, n is the number from 3 to 8, and D is at least one of Li, Na, K, Rb, and Cs.

19. The method of claim 18, wherein the intercalation material is a C1-C20 alkyl ammonium compound.

20. The method of claim 18, wherein the layered ceramic material represented by Formula 4 is at least one of $KSr_2Nb_3O_{10}$, $KSr_2NaNb_4O_{13}$, $KSr_2Na_2Nb_5O_{16}$, $KSr_2NaTa_4O_{13}$, $KSr_2Na_2Ta_5O_{16}$, $KSr_2KNb_4O_{13}$, $KSr_2K_2Nb_5O_{16}$, $KSr_2RbNb_4O_{13}$, $KSr_2Rb_2Nb_5O_{16}$, $KCa_2Nb_3O_{10}$, $KCa_2NaNb_4O_{13}$, $KCa_2Na_2Nb_5O_{16}$, $KCa_2KNb_4O_{13}$, $KCa_2K_2Nb_5O_{16}$, $KCa_2RbNb_4O_{13}$, $KCa_2Rb_2Nb_5O_{16}$, $KCa_2Ta_3O_{10}$, $KCa_2NaTa_4O_{13}$, $KCa_2Na_2Ta_5O_{16}$, $KCa_2KTa_4O_{13}$, $KCa_2K_2Ta_5O_{16}$, $KCa_2RbTa_4O_{13}$, $KCa_2Rb_2Ta_5O_{16}$, $KBa_2Nb_3O_{10}$, $KBa_2NaNb_4O_{13}$, $KBa_2Na_2Nb_5O_{16}$, $KBa_2KNb_4O_{13}$, $KBa_2K_2Nb_5O_{16}$, $KBa_2RbNb_4O_{13}$, $KBa_2Rb_2Nb_5O_{16}$, $KBa_2Ta_3O_{10}$, $KBa_2NaTa_4O_{13}$, $KBa_2Na_2Ta_5O_{16}$, $KBa_2KTa_4O_{13}$, $KBa_2K_2Ta_5O_{16}$, $KBa_2RbTa_4O_{13}$, and $KBa_2Rb_2Ta_5O_{16}$.

21. The method of claim 14, wherein the treating with UV and the reactive gas is performed at a UV power of about 200 W to about 400 W with a UV irradiation duration of about 1 hour to about 60 hours.

22. The method of claim 14, wherein the forming of the dielectric monolayer thin film including the oxide which is represented by Formula 1 and the perovskite-type crystal structure is performed through at least one of a chemical vapor deposition process, an organic metal chemical vapor deposition process, a liquid phase epitaxy process, a sol-gel process, a sputtering process, and a pulsed laser deposition process.

\* \* \* \* \*